(12) United States Patent
Goto

(10) Patent No.: US 7,016,400 B2
(45) Date of Patent: Mar. 21, 2006

(54) DIGITAL MATCHED FILTER DESPREADING RECEIVED SIGNAL AND MOBILE WIRELESS TERMINAL USING DIGITAL MATCHED FILTER

(75) Inventor: Shoji Goto, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 562 days.

(21) Appl. No.: 09/745,996

(22) Filed: Dec. 26, 2000

(65) Prior Publication Data

US 2002/0037030 A1    Mar. 28, 2002

(30) Foreign Application Priority Data

Dec. 27, 1999 (JP) .................................. 11-371634
Dec. 5, 2000 (JP) ............................. 2000-369832

(51) Int. Cl.
*H04B 1/69* (2006.01)
*H04B 1/707* (2006.01)

(52) U.S. Cl. ...................................... 375/150; 375/152
(58) Field of Classification Search ................ 375/143, 375/142, 150, 152, 343, 130, 147, 316; 370/335, 370/340, 441
See application file for complete search history.

(56) References Cited

U.S. PATENT DOCUMENTS

| | | | | |
|---|---|---|---|---|
| 4,660,164 A | * | 4/1987 | Leibowitz | .................... 708/422 |
| 5,933,447 A | * | 8/1999 | Tran et al. | .................... 375/152 |
| 5,999,562 A | * | 12/1999 | Hennedy et al. | ............. 375/152 |
| 6,075,807 A | * | 6/2000 | Warren et al. | ............... 375/143 |

FOREIGN PATENT DOCUMENTS

| | | |
|---|---|---|
| DE | 37 35 374 A1 | 5/1989 |
| JP | 10-285079 | 10/1998 |

OTHER PUBLICATIONS

"74ACT323 8 Bit Universal Shift/Storage Register with Synchronous Reset and Common I/O Pins" (Datasheet; Fairchild Semiconductor, 1988).*

Baier, Alfred; "A Low-Cost Digital Matched Filter for Arbitrary Constant-Envelope Spread-Spectrum Waveforms"; *IEEE Transactions of Communications*; vol. 32, No. 4; Apr. 1984; pp. 354-361.

Tachika, Hisao; "A Development Conditions and Its Technical Issue of Digital Matched Filters in Spread-Spectrum Communication Systems", Technical Report of IEICE SST92-21; 1992.

Tachika, Hisao et al.; "Performance of DS/GMSK/PSK Modulation with Four-phase Correlator and Demodulator LSI for Spread Spectrum Communication", technical Report of IEICE SST96-26; Jun. 1996.

(Continued)

*Primary Examiner*—Chieh M. Fan
*Assistant Examiner*—Jason M. Perilla
(74) *Attorney, Agent, or Firm*—Westerman, Hattori, Daniels & Adrian, LLP

(57) ABSTRACT

A digital matched filter includes a received signal holding unit for holding received signal samples, a spreading code generating unit for generating known spreading codes, and a correlation value calculating unit for calculating a correlation value between the received signal samples and the spreading codes. The received signal holding unit is formed of a plurality of registers arranged in parallel and gate circuits are provided at respective preceding stages for masking signal input unless signal writing is to be performed. The correlation value calculating unit is formed of a plurality of slow-operation calculating circuits arranged in parallel. Each calculating circuit is divided into product-sum calculating units at the anterior and posterior stages respectively. The product-sum calculating unit at the posterior stage is stopped when it is not the time of detecting a peak value in order to reduce power consumption.

14 Claims, 16 Drawing Sheets

OTHER PUBLICATIONS

Gweon-Do Jo et al.: "A Compact Marched Filter for Rapid Code Acquisition" Vehicular Technology Conference, 1999. VTC 1999—Fall. IEEE VTS 50th Amsterdam, Netherlands Sep. 19-22, 1999. Piscataway, NJ, USA, US, vol. 2, pp. 713-717, XP 101353091.

Kim J. H. et al.: "A Robust Code Aquisition Architecture for Non-Coherent Systems Using Dual Digital Matched Filters" Vehicular Technology Conference, 1998, VTC 98. 48th IEEE Ottawa, ONT., Canada May 18-21, 1998, New York, NY, USA, IEEE, US, vol. 3, pp. 2297-2300, XP010288243.

* cited by examiner

F I G. 5

| | INPUT SIGNAL | | | | OUTPUT SIGNAL | | | | | | | |
|---|---|---|---|---|---|---|---|---|---|---|---|---|
| | CLK3 | CLK2 | CLK1 | CLK0 | MSK7 | MSK6 | MSK5 | MSK4 | MSK3 | MSK2 | MSK1 | MSK0 |
| (1) | L | L | L | L | 1 | 1 | 0 | 0 | 0 | 0 | 0 | 0 |
| (2) | L | L | L | H | 0 | 1 | 0 | 0 | 0 | 0 | 1 | 0 |
| (3) | L | L | H | L | 1 | 0 | 0 | 1 | 0 | 0 | 0 | 0 |
| (4) | L | L | H | H | 0 | 0 | 0 | 1 | 0 | 0 | 1 | 0 |
| (5) | L | H | L | L | 0 | 1 | 0 | 0 | 1 | 0 | 0 | 0 |
| (6) | L | H | L | H | 0 | 1 | 1 | 0 | 0 | 0 | 0 | 0 |
| (7) | L | H | H | L | 0 | 0 | 0 | 1 | 1 | 0 | 0 | 0 |
| (8) | L | H | H | H | 1 | 0 | 0 | 0 | 0 | 0 | 0 | 0 |
| (9) | H | L | L | L | 1 | 0 | 0 | 0 | 0 | 0 | 0 | 1 |
| (10) | H | L | L | H | 0 | 0 | 0 | 0 | 0 | 1 | 1 | 1 |
| (11) | H | L | H | L | 0 | 0 | 1 | 0 | 0 | 0 | 0 | 0 |
| (12) | H | L | H | H | 0 | 0 | 1 | 0 | 1 | 0 | 0 | 1 |
| (13) | H | H | L | L | 0 | 0 | 0 | 0 | 0 | 0 | 0 | 0 |
| (14) | H | H | L | H | 0 | 0 | 0 | 0 | 0 | 1 | 0 | 1 |
| (15) | H | H | H | L | 0 | 0 | 0 | 0 | 1 | 0 | 0 | 0 |
| (16) | H | H | H | H | 0 | 0 | 0 | 0 | 1 | 1 | 0 | 0 |

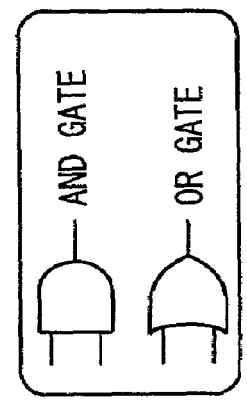
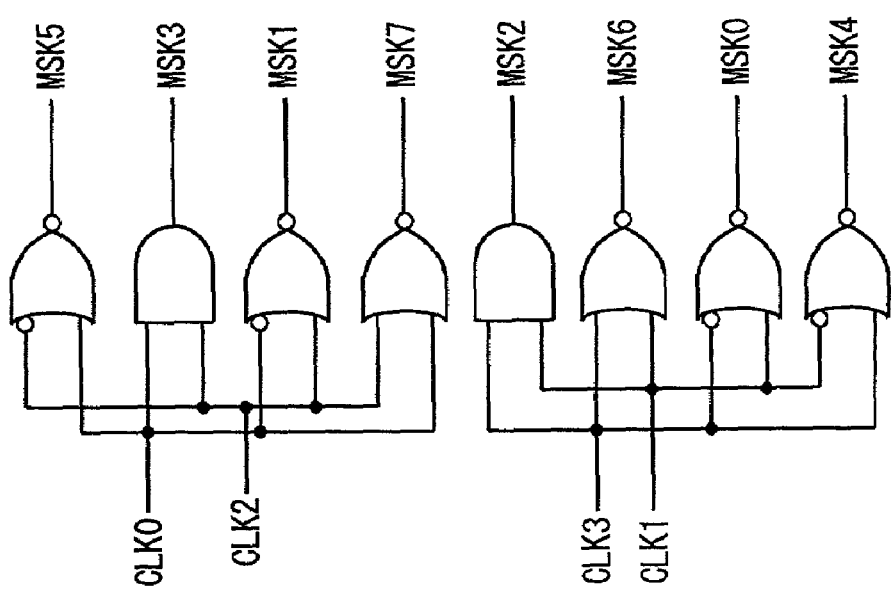
FIG. 6

F I G. 1 1
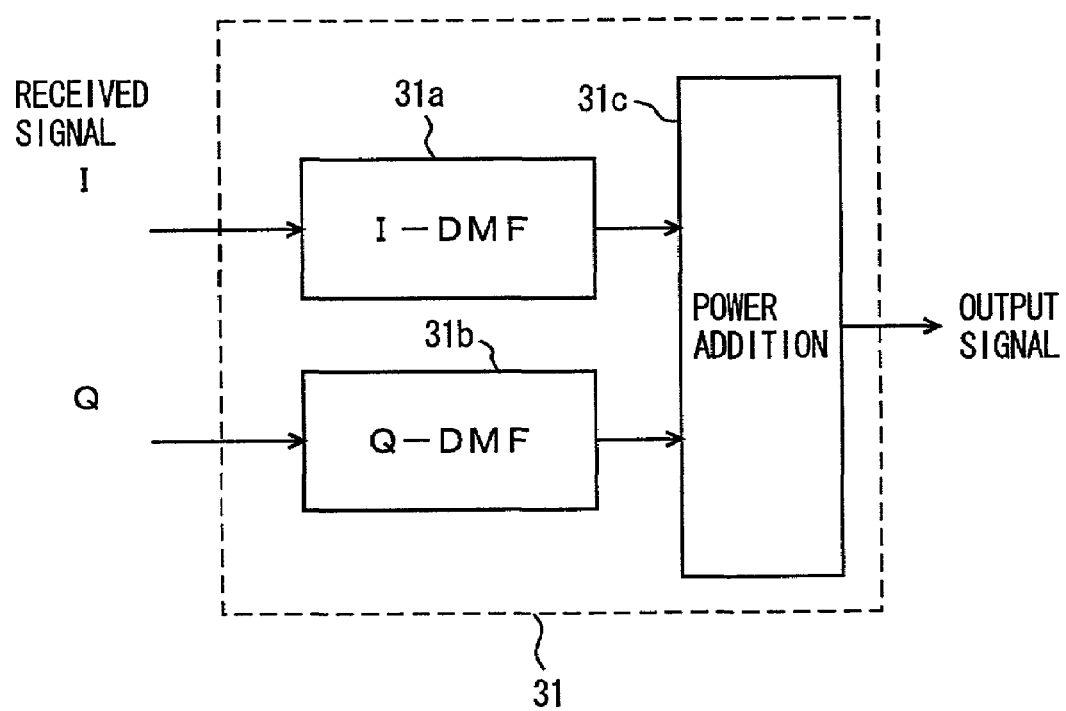

F I G. 1 2 A
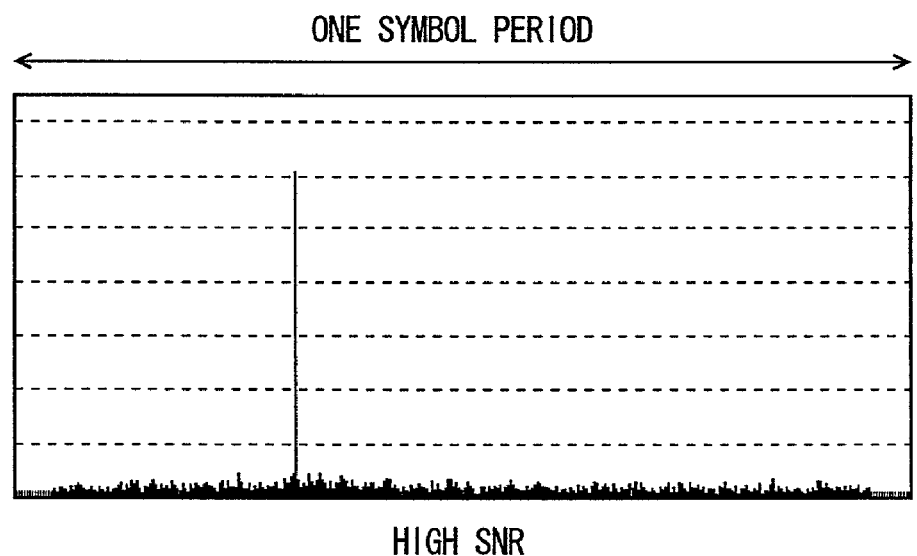
HIGH SNR
F I G. 1 2 B
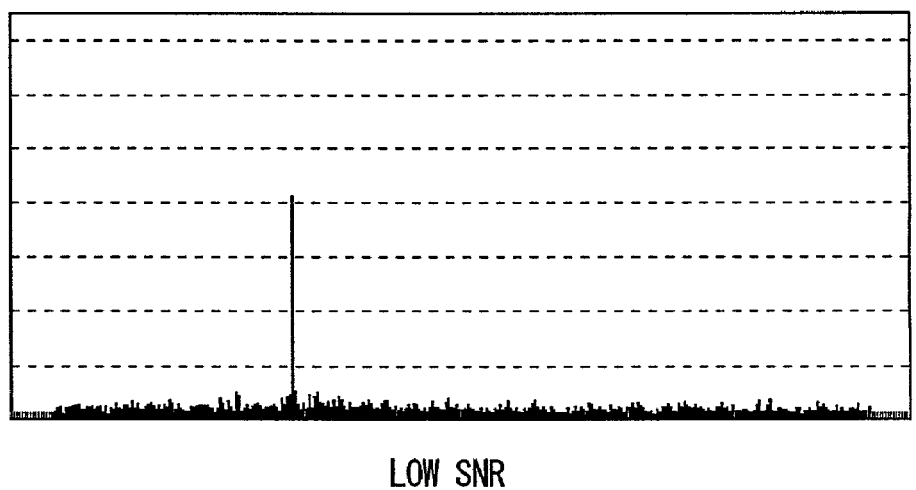
LOW SNR

DIGITAL MATCHED FILTER DESPREADING RECEIVED SIGNAL AND MOBILE WIRELESS TERMINAL USING DIGITAL MATCHED FILTER

BACKGROUND OF THE INVENTION

1. Field of the Invention

The present invention relates to a digital matched filter and a mobile wireless terminal employing the digital matched filter. In particular, the invention relates to a digital matched filter to perform despreading at the receiving end in a direct sequence spread spectrum communication system as well as a mobile wireless terminal including such a digital matched filter.

2. Description of the Related Art

In digital radio communication like that of CDMA (Code Division Multiple Access) system, for example, direct sequence spread spectrum communication system has conventionally been employed. In the direct sequence spread spectrum communication system, digital transmission data is scrambled by a spreading code sequence specific to each user and then transmitted, and the receiving end descrambles the received digital data by a despreading code sequence.

At the transmitting end of the digital radio communication using such direct sequence spread spectrum communication system, a spreading unit is provided for generating a spreading code sequence to scramble digital transmission data. At the receiving end, a despreading unit is provided for generating a replica signal of the spreading code sequence to descramble received digital data.

This direct sequence spread spectrum communication system requires the timing of generating a spreading code at the receiving end to be synchronized with the timing of generating a spreading code at the transmitting end.

FIG. 14 is a schematic block diagram showing a basic structure of a transmitter and a receiver in the direct sequence spread spectrum communication system as discussed above.

Referring to FIG. 14, the direct sequence spread spectrum communication system is basically constituted of transmitter 60 and receiver 65.

In transmitter 60, an original signal to be transmitted is supplied to a primary modulator 61 to narrow the bandwidth of the signal in terms of effective use of radio waves.

An output of primary modulator 61 is supplied to a spreading unit 62 to be spread, i.e., scrambled (secondary modulation) by a spreading code sequence supplied from a spreading code generating unit (not shown) provided therein.

An output of spreading unit 62 is processed as required for radio communication by a transmission circuit (not shown) and then transmitted via an antenna 63.

The signal transmitted from antenna 63 is received by an antenna 64 of receiver 65 to be processed by a reception circuit (not shown) as required for radio reception and then supplied to a despreading unit 66.

Despreading unit 66 despreads, i.e., descrambles the received signal by a replica signal synchronized with the spreading code sequence at the transmitting end, that is supplied from a spreading code generating unit (not shown) provided therein.

The original signal is thus derived from despreading unit 66 and demodulated by a demodulating unit 67.

In order to achieve despreading at the receiver side in synchronism with the transmitter side, despreading unit 66 at the receiver side must shift the spreading code sequence of the receiver side to eliminate timing difference between the spreading code sequence at the receiver and that at the transmitter and accordingly establish initial synchronism with the spreading code sequence of the transmitter side.

FIG. 15 is a schematic block diagram showing a conventional initial synchronizing circuit for accomplishment of such initial synchronism and its control circuit.

Initial synchronizing circuit 70 and control circuit 80 shown in FIG. 15 are included in despreading unit 66 in FIG. 14. Initial synchronizing circuit 70 includes a digital matched filter 71, a cyclic integration unit 72 and a synchronism acquisition decision unit 73.

Digital matched filter 71 is employed because of its superior peak detection speed for a correlation value between a received signal and a spreading code. The digital matched filter is discussed in detail for example by Tachika in "Digital Matched Filter Technique in Spread Spectrum Communication and its Problems," *IEICE Technical Report* SST 62-21.

Digital matched filter 71 calculates a correlation value between a received input signal and a replica signal of the spreading code sequence generated therein to output the resultant value as a despread signal. The despread signal thus output is supplied to demodulating unit 67 in FIG. 14 as well as cyclic integration unit 72. Details of the structure and operation of conventional digital matched filter 71 are discussed later.

It is noted that the spreading code sequence is formed of spreading codes repeated in a certain repetition period and this repetition period of the spreading codes is hereinafter referred to "frame."

Cyclic integration unit 72 determines an integral of correlation values supplied from digital matched filter 71 over a period of several frames of a spreading code sequence to average the correlation values, in order to eliminate noise and improve accuracy of detecting the peak value of the correlation values.

Here, the energy of a received signal per one bit of information is represented by $E_b$ and the density of noise and interference signals per 1 Hz is represented by $N_o$. If $E_b/N_o$ indicates a large value, it means that the energy of the received signal is relatively high, so that the peak value of correlation values in each frame is easily detected. However, if $E_b/N_o$ is small, it means a relatively low energy of the received signal and thus detection is difficult of the peak value of correlation values as they are in each frame.

Then, the accuracy of peak detection of correlation values can be improved by averaging correlation values of multiple frames even if $E_b/N_o$ is small. A digital matched filter using this cyclic integration is discussed in detail, for example, by Tachika et al in "DS/GMSK/PSK System Using Four-Phase Correlator and Spread Spectrum Demodulation LSI," *IEICE Technical Report* SST96-26.

Referring again to FIG. 15, the integral of the correlation values determined by cyclic integration unit 72 is supplied to synchronism acquisition decision unit 73. Synchronism acquisition decision unit 73 decides whether the supplied integral of the correlation values is greater than a threshold value set therein in advance.

Specifically, if the peak of correlation values resultant from the averaging exceeds the threshold value, a signal indicating this (e.g. "1") is supplied to control unit 80. If there is no correlation value peak exceeding the threshold value, a signal indicating this (e.g. "0") is supplied to control unit 80.

If a signal "1" is supplied from synchronism acquisition decision unit 73, control unit 80 finds that the phase difference between respective spreading code sequences of the transmitter and the receiver is within an error corresponding to "a fraction of operating frequency of digital matched filter 71" namely that rough synchronism is accomplished, and accordingly controls timing of generating a spreading code sequence by digital matched filter 71 such that the spreading code sequence generation timing for despreading is maintained.

If a signal "0" is supplied from synchronism acquisition decision unit 73, control unit 80 finds that the phase difference between respective spreading code sequences of the transmitter and the receiver is greater than the error corresponding to "a fraction of operating frequency of digital matched filter 71" namely that rough synchronism is not achieved, and then controls generation timing of a spreading code sequence by digital matched filter 71 such that the generation timing of a spreading code sequence for despreading is shifted to establish rough synchronism. The timing of generating spreading codes is controlled more specifically by rewriting a spreading code register value (tap coefficient) or updating a received signal storage register value.

Control unit 80 monitors output of synchronism acquisition decision circuit 73 even after the rough synchronism is established so as to control spreading code sequence generation timing by digital matched filter 71 and accordingly maintain the rough synchronism. In this way, the initial synchronism is achieved.

The structure and operation of digital matched filter 71 shown in FIG. 15 are now described in detail below.

FIG. 16 is a block diagram showing a structure of a transversal filter as one example of digital matched filter 71. Referring to FIG. 16, in the structure of a spreading code replica generator 71*a*, an initial value specific to the system is set in a shift register (not shown) having a structure based on a predetermined generating polynomial, shifting operation is performed a predetermined number of times based on the initial value, and then resultant codes are output successively as a spreading code sequence known to the transmitter and receiver sides.

Chips corresponding to one frame of spreading codes generated by spreading code replica generator 71*a* are input to a spreading code register for input 71*b* at a chip rate of the spreading codes and then stored therein. The chips corresponding to one frame of spreading codes stored in input spreading code register 71*b* are transferred to a spreading code register for operation 71*c* and stored therein.

On the other hand, a received signal formed of samples each quantized to n-bit (n is an integer satisfying n≧1) is oversampled at an oversampling rate which is M times (M is an integer satisfying M≧1) as high as the chip rate of spreading codes and supplied in time-series manner to a received signal storage register 71*d*. In this register, received signal samples having a code length corresponding to M times the number of chips corresponding to one frame of spreading codes (hereinafter referred to as a spreading code length) are successively stored. The example shown in FIG. 16 is applied to M=2 for the purpose of simplifying description.

There is a received signal sequence that includes samples with the number thereof two times the spreading code length and is stored in received signal storage register 71*d* which is a shift register. Samples held in every other stages beginning from the initial stage (odd number stages) are output at a certain timing in parallel (tap outputs) each supplied to one input of a corresponding one of multipliers constituting a multiplying unit 71*e*.

The chips corresponding to one frame of spreading codes stored in operation spreading code register 71*c* are output in parallel (tap coefficients) each supplied to the other input of a corresponding one of multipliers constituting multiplying unit 71*e*.

Respective outputs of all multipliers constituting multiplying unit 71*e* are summed by an adding unit 71*f* and the resultant value is output as a correlation value at this time.

Subsequent sample of a received signal sequence is input at the next timing in received signal storage register 71*d*, and the samples held in respective stages are each shifted to the next stage. At this timing, those samples (tap outputs) held in the odd number stages of shift register 71*d* are multiplied in multiplying unit 71*e* by the chips (tap coefficients) corresponding to one frame of spreading codes that are fixed in shift register 71*c*, and the sum of resultant values is calculated by adding unit 71*f* to be output as a correlation value.

In this digital matched filter 71 shown in FIG. 16, received signal samples are input to received signal storage register 71*d* at the sampling rate two times the chip rate of spreading codes, and samples in every other stages are used as tap outputs for calculating the correlation value. Every time subsequent sample is input and the sample in each stage is shifted, the correlation value calculation is performed. Therefore, all samples of input and received signals that are oversampled are used for the correlation value calculation.

It is noted that the number of chips of spreading codes stored in operation spreading code register 71*c* may not the spreading code length corresponding to one frame. In other words, even if spreading codes forming one frame are partially used, received signal samples corresponding to that number of chips may be used for calculating the correlation value. Then, the peak indicates the synchronism position so that acquisition of the synchronism position is possible by product-sum operation of partial codes.

In this case, correlation value calculation can be continued by fixing part of the spreading codes of one frame in operation spreading code register 71*c* while remaining spreading codes of that one frame are stored in input spreading code register 71*b* so as to replace the spreading codes in register 71*c* with those in register 71*b* as required.

In the conventional digital matched filter shown in FIG. 16, every time each sample of a received signal sequence is input to received signal storage register 71*d* at the oversampling rate, in other words, for all received signal samples temporarily stored in register 71*d*, multiplying unit 71*e* and adding unit 71*f* perform the product-sum operation for received signals and spreading codes. A problem here is thus a remarkable increase in power consumption by the entire digital matched filter since many logic circuits operate each time the product-sum operation is performed.

Further, in the conventional digital matched filter in FIG. 16, received signal storage register 71*d* holds a received signal with the number of samples M times the spreading code length, and the register is accordingly constituted of a shift register having a numerical number of stages, resulting in increase in power consumption due to successive shifting operation for data samples.

A digital matched filter proposed accordingly is disclosed for example in Japanese Patent Laying-Open No. 10-285079. The proposed digital matched filter includes a received signal storage register constituted of a plurality of registers provided in parallel with respect to an input and received signal instead of the shift register, and samples of a received signal sequence supplied in time-series manner are cyclically written at a predetermined timing into the registers.

However, in the digital matched filter having the structure as described above, the received signal samples that are input are supplied commonly to the registers provided in parallel with respect to the input received signal. As a result, sample data is input to a register not at a correct write timing. Even if a register is not at the write timing and not activated, that register consumes power if it receives any signal. Therefore, even if such a digital matched filter does not employ the shift register, the consumption power as a whole increases.

A further problem is that circuits 71e and 71f for performing the product-sum operation for received signals input at the oversampling rate and spreading codes operate at a remarkably high operating frequency and consequently these circuits consume increased power resulting in increase in the consumption power of the entire digital matched filter.

SUMMARY OF THE INVENTION

An object of the present invention is therefore to provide a digital matched filter consuming less power while maintaining accuracy of peak detection for a correlation value between a received signal and spreading codes, as well as a mobile wireless terminal employing such a digital matched filter.

Another object of the invention is to provide a digital matched filter implementing reduction of power consumption in those circuits for calculating a correlation value, by performing all product-sum operations only when a correlation value between a received signal and spreading codes could be the peak value, as well as a mobile wireless terminal employing such a digital matched filter.

Still another object of the invention is to provide a digital matched filter implementing reduction of power consumption in parallel registers that constitute a received signal storage register by masking respective inputs of registers except for registers at the correct write timing, as well as a mobile wireless terminal employing such a digital matched filter.

A further object of the invention is to provide a digital matched filter implementing reduction in power consumption by providing a plurality of correlation value calculating circuits in parallel so as to reduce the operating frequency of each correlation value calculating circuit, as well as a mobile wireless terminal employing such a digital matched filter.

The present invention is a digital matched filter for despreading on the receiving side a received signal sequence that has been spread on the transmitting side. The digital matched filter includes a received signal holding unit, a spreading code generating unit, and a correlation value calculating unit. The received signal holding unit successively holds a predetermined number of samples among samples constituting the received signal sequence input in time-series manner. The spreading code generating unit generates a spreading code sequence for the despreading process. The correlation value calculating unit calculates a correlation value between the predetermined number of samples held in the received signal holding unit and the generated spreading code sequence. The correlation value calculating unit includes a first product-sum calculating unit for calculating a correlation value between a part of the predetermined number of samples held in the received signal holding unit and spreading codes corresponding to that part of samples in the generated spreading code sequence, a second product-sum calculating unit for calculating a correlation value between the rest of samples of the predetermined number of samples held in the received signal holding unit and spreading codes corresponding to the rest of samples in the generated spreading code sequence, and a decision unit for deciding whether the correlation value output from the first product-sum calculating unit exceeds a predetermined threshold value to stop calculation by the second product-sum calculating unit when the decision unit decides that the correlation value output from the first product-sum calculating unit does not exceed the predetermined threshold value.

According to another aspect of the invention, a digital matched filter for despreading on the receiving side a received signal sequence that has been spread on the transmitting side includes a received signal holding unit for successively holding samples constituting the received signal sequence input in time-series manner. The received signal holding unit includes a predetermined number of storage circuits for holding in parallel samples in the predetermined number of the received signal sequence input in time-series manner, logic circuits in the predetermined number provided at respective preceding stages of the predetermined number of storage circuits, the logic circuits each activated to pass an input signal to a corresponding one of the storage circuits and mask the input signal otherwise, a first control unit for cyclically causing write enable state of the predetermined number of storage circuits at predetermined timing to cyclically write the samples of the received signal sequence input in time-series manner into the predetermined number of storage circuits at the predetermined timing, and a second control unit for cyclically activating the predetermined number of logic circuits at the predetermined timing to cyclically input the samples of the received signal sequence input in time-series manner to the predetermined number of storage circuits at the predetermined timing. The digital matched filter further includes a spreading code generating unit for generating a spreading code sequence for the despreading process, and a correlation value calculating unit for calculating a correlation value between the samples of the received signal sequence held in parallel in the predetermined number of storage circuits and the spreading code sequence.

Preferably, the predetermined number of logic circuits each have a load capacitance smaller than a load capacitance of each of the predetermined number of storage circuits.

According to still another aspect of the invention, a digital matched filter for despreading on the receiving side a received signal sequence that has been spread on the transmitting side includes a received signal holding unit, a spreading code generating unit, correlation value calculating units in a second predetermined number, and an output control unit. The received signal holding unit successively holds a first predetermined number of samples among samples constituting the received signal sequence input in time-series manner. The first predetermined number of samples held are divided into the second predetermined number of groups. The spreading code generating unit generates a spreading code sequence for the despreading process. The correlation value calculating units in the second predetermined number are provided respectively corresponding to the second predetermined number of groups each for calculating a correlation value between samples of a corresponding group and the spreading code sequence. The output control unit successively outputs in time-series manner respective correlation values supplied from the second predetermined number of correlation value calculating units as correlation values output from one system.

According to a further aspect of the invention, a digital matched filter for despreading on the receiving side a received signal sequence that has been spread on the transmitting side includes a received signal holding unit for successively holding samples constituting the received signal sequence input in time-series manner. The received signal holding unit includes a predetermined number of storage circuits for holding in parallel samples in the predetermined number of the received signal sequence input in time-series manner, logic circuits in the predetermined number provided at respective preceding stages of the predetermined number of storage circuits, the logic circuits each activated to pass an input signal to a corresponding one of the storage circuits and mask the input signal otherwise, a first control unit for cyclically causing write enable state of the predetermined number of storage circuits at predetermined timing to cyclically write the samples of the received signal sequence input in time-series manner into the predetermined number of storage circuits at the predetermined timing, and a second control unit for cyclically activating the predetermined number of logic circuits at the predetermined timing to cyclically input the samples of the received signal sequence input in time-series manner to the predetermined number of storage circuits at the predetermined timing. The digital matched filter further includes a spreading code generating unit for generating a spreading code sequence for the despreading process, and a correlation value calculating unit for calculating a correlation value between the samples of the received signal sequence held in parallel in the predetermined number of storage circuits and the spreading code sequence. The correlation value calculating unit includes a first product-sum calculating unit for calculating a correlation value between a part of samples held in the predetermined number of storage circuits and spreading codes corresponding to that part of samples in the generated spreading code sequence, a second product-sum calculating unit for calculating a correlation value between the rest of samples held in the predetermined number of storage circuits and spreading codes corresponding to the rest of samples in the generated spreading code sequence, and a decision unit for deciding whether the correlation value output from the first product-sum calculating unit exceeds a predetermined threshold value to stop calculation by the second product-sum calculating unit when the decision unit decides that the correlation value output from the first product-sum calculating unit does not exceed the predetermined threshold value.

Preferably, the predetermined number of logic circuits each have a load capacitance smaller than a load capacitance of each of the predetermined number of storage circuits.

According to a further aspect of the invention, a digital matched filter for despreading on the receiving side a received signal sequence that has been spread on the transmitting side includes a received signal holding unit for successively holding samples constituting the received signal sequence input in time-series manner. The received signal holding unit includes a first predetermined number of storage circuits for holding in parallel samples in the first predetermined number of the received signal sequence input in time-series manner, the first predetermined number of storage circuits being divided into a second predetermined number of groups, logic circuits in the first predetermined number provided at respective preceding stages of the first predetermined number of storage circuits, the logic circuits each activated to pass an input signal to a corresponding one of the storage circuits and mask the input signal otherwise, a first control unit for cyclically causing write enable state of the first predetermined number of storage circuits at predetermined timing to cyclically write the samples of the received signal sequence input in time-series manner into the first predetermined number of storage circuits at the predetermined timing, and a second control unit for cyclically activating the first predetermined number of logic circuits at the predetermined timing to cyclically input the samples of the received signal sequence input in time-series manner to the first predetermined number of storage circuits at the predetermined timing. The digital matched filter further includes a spreading code generating unit for generating a spreading code sequence for the despreading process and correlation value calculating units in the second predetermined number provided respectively corresponding to the second predetermined number of groups each for calculating a correlation value between samples held in parallel in storage circuits of a corresponding group and the spreading code sequence. The second predetermined number of correlation value calculating units each include a first product-sum calculating unit for calculating a correlation value between a part of samples held in the storage circuits of the corresponding group and spreading codes corresponding to that part of samples in the generated spreading code sequence, a second product-sum calculating unit for calculating a correlation value between the rest of samples held in the storage circuits of the corresponding group and spreading codes corresponding to the rest of samples in the generated spreading code sequence, and a decision unit for deciding whether the correlation value output from the first product-sum calculating unit exceeds a predetermined threshold value to stop calculation by the second product-sum calculating unit when the decision unit decides that the correlation value output from the first product-sum calculating unit does not exceed the predetermined threshold value. The digital matched filter further includes an output control unit for successively outputting in time-series manner respective correlation values output from the second predetermined number of correlation value calculating units as correlation values output from one system.

Preferably, the predetermined number of logic circuits each have a load capacitance smaller than a load capacitance of each of the predetermined number of storage circuits.

According to a further aspect of the invention, a mobile wireless terminal for digital radio communication includes a reception-related modem unit for demodulating received digital data and a signal processing unit for processing a signal received by the reception-related modem unit to output the processed signal. The reception-related modem unit includes a digital matched filter for despreading on the reception side a received signal sequence that has been spread on the transmission side. The digital matched filter includes a received signal holding unit, a spreading code generating unit, and a correlation value calculating unit. The received signal holding unit successively holds a predetermined number of samples among samples constituting the received signal sequence input in time-series manner. The spreading code generating unit generates a spreading code sequence for the despreading process. The correlation value calculating unit calculates a correlation value between the predetermined number of samples held in the received signal holding unit and the generated spreading code sequence. The correlation value calculating unit includes a first product-sum calculating unit for calculating a correlation value between a part of the predetermined number of samples held in the received signal holding unit and spreading codes corresponding to that part of samples in the generated spreading code sequence, a second product-sum calculating unit for calculating a correlation value between the rest of samples of the predetermined number of samples held in the received signal holding unit and spreading codes corresponding to the rest of samples in the generated spreading code sequence, and a decision unit for deciding whether the correlation value output from the first product-sum calculating unit exceeds a predetermined threshold value to stop calculation by the second product-sum calculating unit when the decision unit decides that the correlation value output from the first product-sum calculating unit does not exceed the predetermined threshold value.

According to a further aspect of the invention, a mobile wireless terminal for digital radio communication includes a reception-related modem unit for demodulating received digital data and a signal processing unit for processing a signal received by the reception-related modem unit to output the processed signal. The reception-related modem unit includes a digital matched filter for despreading on the reception side a received signal sequence that has been spread on the transmission side. The digital matched filter includes a received signal holding unit for successively holding samples constituting the received signal sequence input in time-series manner. The received signal holding unit includes a predetermined number of storage circuits for holding in parallel samples in the predetermined number of the received signal sequence input in time-series manner, logic circuits in the predetermined number provided at respective preceding stages of the predetermined number of storage circuits, the logic circuits each activated to pass an input signal to a corresponding one of the storage circuits and mask the input signal otherwise, a first control unit for cyclically causing write enable state of the predetermined number of storage circuits at predetermined timing to cyclically write the samples of the received signal sequence input in time-series manner into the predetermined number of storage circuits at the predetermined timing, and a second control unit for cyclically activating the predetermined number of logic circuits at the predetermined timing to cyclically input the samples of the received signal sequence input in time-series manner to the predetermined number of storage circuits at the predetermined timing. The digital matched filter further includes a spreading code generating unit for generating a spreading code sequence for the despreading process and a correlation value calculating unit for calculating a correlation value between the samples of the received signal sequence held in parallel in the predetermined number of storage circuits and the spreading code sequence.

Preferably, the predetermined number of logic circuits each have a load capacitance smaller than a load capacitance of each of the predetermined number of storage circuits.

According to a further aspect of the invention, a mobile wireless terminal for digital radio communication includes a reception-related modem unit for demodulating received digital data and a signal processing unit for processing a signal received by the reception-related modem unit to output the processed signal. The reception-related modem unit includes a digital matched filter for despreading on the reception side a received signal sequence that has been spread on the transmission side. The digital matched filter includes a received signal holding unit, a spreading code generating unit, correlation value calculating units in a second predetermined number, and an output control unit. The received signal holding unit successively holds a first predetermined number of samples among samples constituting the received signal sequence input in time-series manner, the first predetermined number of samples held being divided into groups in the second predetermined number. The spreading code generating unit generates a spreading code sequence for the despreading process. The correlation value calculating units in the second predetermined number are provided respectively corresponding to the second predetermined number of groups, each for calculating a correlation value between samples of a corresponding group and the spreading code sequence. The output control unit successively outputs in time-series manner respective correlation values output from the second predetermined number of correlation value calculating units as correlation values output from one system.

According to a further aspect of the invention, a mobile wireless terminal for digital radio communication includes a reception-related modem unit for demodulating received digital data and a signal processing unit for processing a signal received by the reception-related modem unit to output the processed signal. The reception-related modem unit includes a digital matched filter for despreading on the reception side a received signal sequence that has been spread on the transmission side. The digital matched filter includes a received signal holding unit for successively holding samples constituting the received signal sequence input in time-series manner. The received signal holding unit includes a predetermined number of storage circuits for holding in parallel samples in the predetermined number of the received signal sequence input in time-series manner, logic circuits in the predetermined number provided at respective preceding stages of the predetermined number of storage circuits, the logic circuits each activated to pass an input signal to a corresponding one of the storage circuits and mask the input signal otherwise, a first control unit for cyclically causing write enable state of the predetermined number of storage circuits at predetermined timing to cyclically write the samples of the received signal sequence input in time-series manner into the predetermined number of storage circuits at the predetermined timing, and a second control unit for cyclically activating the predetermined number of logic circuits at the predetermined timing to cyclically input the samples of the received signal sequence input in time-series manner to the predetermined number of storage circuits at the predetermined timing. The digital matched filter further includes a spreading code generating unit for generating a spreading code sequence for the despreading process and a correlation value calculating unit for calculating a correlation value between the samples of the received signal sequence held in parallel in the predetermined number of storage circuits and the spreading code sequence. The correlation value calculating unit includes a first product-sum calculating unit for calculating a correlation value between a part of samples held in the predetermined number of storage circuits and spreading codes corresponding to that part of samples in the generated spreading code sequence, a second product-sum calculating unit for calculating a correlation value between the rest of samples held in the predetermined number of storage circuits and spreading codes corresponding to the rest of samples in the generated spreading code sequence, and a decision unit for deciding whether the correlation value output from the first product-sum calculating unit exceeds a predetermined threshold value to stop calculation by the second product-sum calculating unit when the decision unit decides that the correlation value output from the first product-sum calculating unit does not exceed the predetermined threshold value.

Preferably, the predetermined number of logic circuits each have a load capacitance smaller than a load capacitance of each of the predetermined number of storage circuits.

According to a further aspect of the invention, a mobile wireless terminal for digital radio communication includes a reception-related modem unit for demodulating received digital data and a signal processing unit for processing a signal received by the reception-related modem unit to output the processed signal. The reception-related modem unit includes a digital matched filter for despreading on the reception side a received signal sequence that has been spread on the transmission side. The digital matched filter includes a received signal holding unit for successively holding samples constituting the received signal sequence input in time-series manner. The received signal holding unit includes a first predetermined number of storage circuits for holding in parallel samples in the first predetermined number of the received signal sequence input in time-series manner, the first predetermined number of storage circuits being divided into a second predetermined number of groups, logic circuits in the first predetermined number provided at respective preceding stages of the first predetermined number of storage circuits, the logic circuits each activated to pass an input signal to a corresponding one of the storage circuits and mask the input signal otherwise, a first control unit for cyclically causing write enable state of the first predetermined number of storage circuits at predetermined timing to cyclically write the samples of the received signal sequence input in time-series manner into the first predetermined number of storage circuits at the predetermined timing, and a second control unit for cyclically activating the first predetermined number of logic circuits at the predetermined timing to cyclically input the samples of the received signal sequence input in time-series manner to the first predetermined number of storage circuits at the predetermined timing. The digital matched filter further includes a spreading code generating unit for generating a spreading code sequence for the despreading process, and a correlation value calculating units in the second predetermined number provided respectively corresponding to the second predetermined number of groups each for calculating a correlation value between samples held in parallel in storage circuits of a corresponding group and the spreading code sequence. The second predetermined number of correlation value calculating units each include a first product-sum calculating unit for calculating a correlation value between a part of samples held in the storage circuits of the corresponding group and spreading codes corresponding to that part of samples in the generated spreading code sequence, a second product-sum calculating unit for calculating a correlation value between the rest of samples held in the storage circuits of the corresponding group and spreading codes corresponding to the rest of samples in the generated spreading code sequence, and a decision unit for deciding whether the correlation value output from the first product-sum calculating unit exceeds a predetermined threshold value to stop calculation by the second product-sum calculating unit when the decision means decides that the correlation value output from the first product-sum calculating unit does not exceed the predetermined threshold value. The digital matched filter further includes an output control unit for successively outputting in time-series manner respective correlation values output from the second predetermined number of correlation value calculating units as correlation values output from one system.

Preferably, the first predetermined number of logic circuits each have a load capacitance smaller than a load capacitance of each of the first predetermined number of storage circuits.

According to the present invention as discussed above, all product-sum calculations for determining correlation values are performed only when there is a possibility that a correlation value between a received signal and spreading codes has the peak value. Otherwise, the product-sum calculations are just partially performed. In this way, power consumption of a product-sum calculating circuit for determining a correlation value can be reduced remarkably.

In addition, according to the invention, it is possible to prevent power consumption due to unnecessary signal input to any register of parallel registers that is not at write timing, by masking input to the register except for those registers at the actual write timing.

Further, according to the invention, it is possible to reduce power consumption for calculation of correlation values, by providing a plurality of product-sum calculating circuits for determining correlation values in parallel corresponding to a plurality of groups of received signal samples.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows one example of a truth table of a mask signal generating unit 7b.

FIG. 6 is a block diagram showing one example of a logic circuit structure of mask signal generating unit 7b that implements the truth table shown in FIG. 5.

FIG. 11 is a block diagram showing a structure of a digital matched filter 31 for P-SCH in compliance with the system defined in 3GPP.

FIG. 12A and 12B are waveform charts showing peak value characteristics of a correlation value output from digital matched filter 31 for P-SCH in FIG. 11.

DESCRIPTION OF THE PREFERRED EMBODIMENTS

Figure 1:
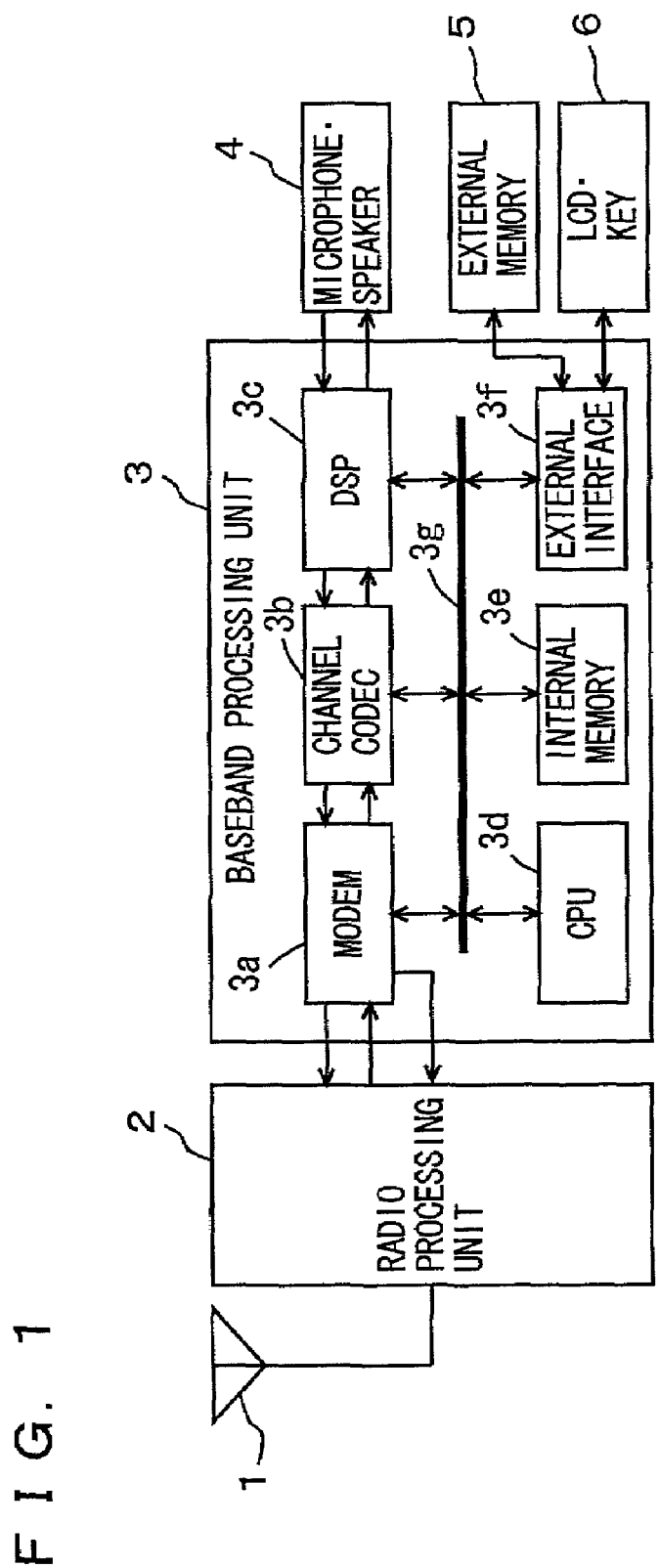
FIG. 1 is a schematic block diagram showing the entire structure of a mobile wireless terminal for digital radio communication to which a digital matched filter according to the present invention is applied.

Embodiments of the present invention are now described in detail in conjunction with the drawings. It is noted that the same or corresponding components in the drawings have the same or like reference characters and description thereof is not repeated here.

FIG. 1 is a schematic block diagram showing the entire structure of a mobile wireless terminal for digital radio communication to which a digital matched filter according to the invention is applied.

The mobile wireless terminal shown in FIG. 1 is generally constituted of an antenna 1, a radio processing unit 2, a baseband processing unit 3, a speech input/output device 4 formed of a microphone and a speaker, an external memory 5, and a display/input device 6 formed of an LCD and keys.

In particular, baseband processing unit 3 includes a modem 3a, a channel codec 3b, a DSP (digital signal processor) 3c, a CPU 3d, an internal memory 3e, an external interface 3f, and an internal bus 3g.

A radio wave signal supplied from a base station (not shown) and received by antenna 1 is converted by radio processing unit 2 into a baseband signal to be supplied to baseband processing unit 3.

In baseband processing unit 3, the received signal is demodulated by modem 3a and further decoded by channel codec 3b to be supplied to DSP 3c. DSP 3c performs data processing for the received signal and drives the speaker of speech input/output device 4 to convert the received signal into speech.

On the other hand, speech input by means of the microphone of speech input/output device 4 undergoes data processing by DSP 3c to be supplied to channel codec 3b. Channel codec 3b encodes the supplied speech signal and provides the signal to modem 3a, and modem 3a modulates the transmission signal thus provided and supplies the modulated signal to radio processing unit 2. Radio processing unit 2 performs radio processing on the transmission signal and transmits the signal toward the base station (not shown) via antenna 1.

Modem 3a, channel codec 3b and DSP 3c are connected via internal bus 3g to CPU 3d, internal memory 3e and external interface 3f. CPU 3d controls the entire operation of the mobile wireless terminal in FIG. 1 in accordance with a program stored in internal memory 3e. External interface 3f functions as an interface with external memory 5 and display/input device 6.

FIRST EMBODIMENT

Figure 2:
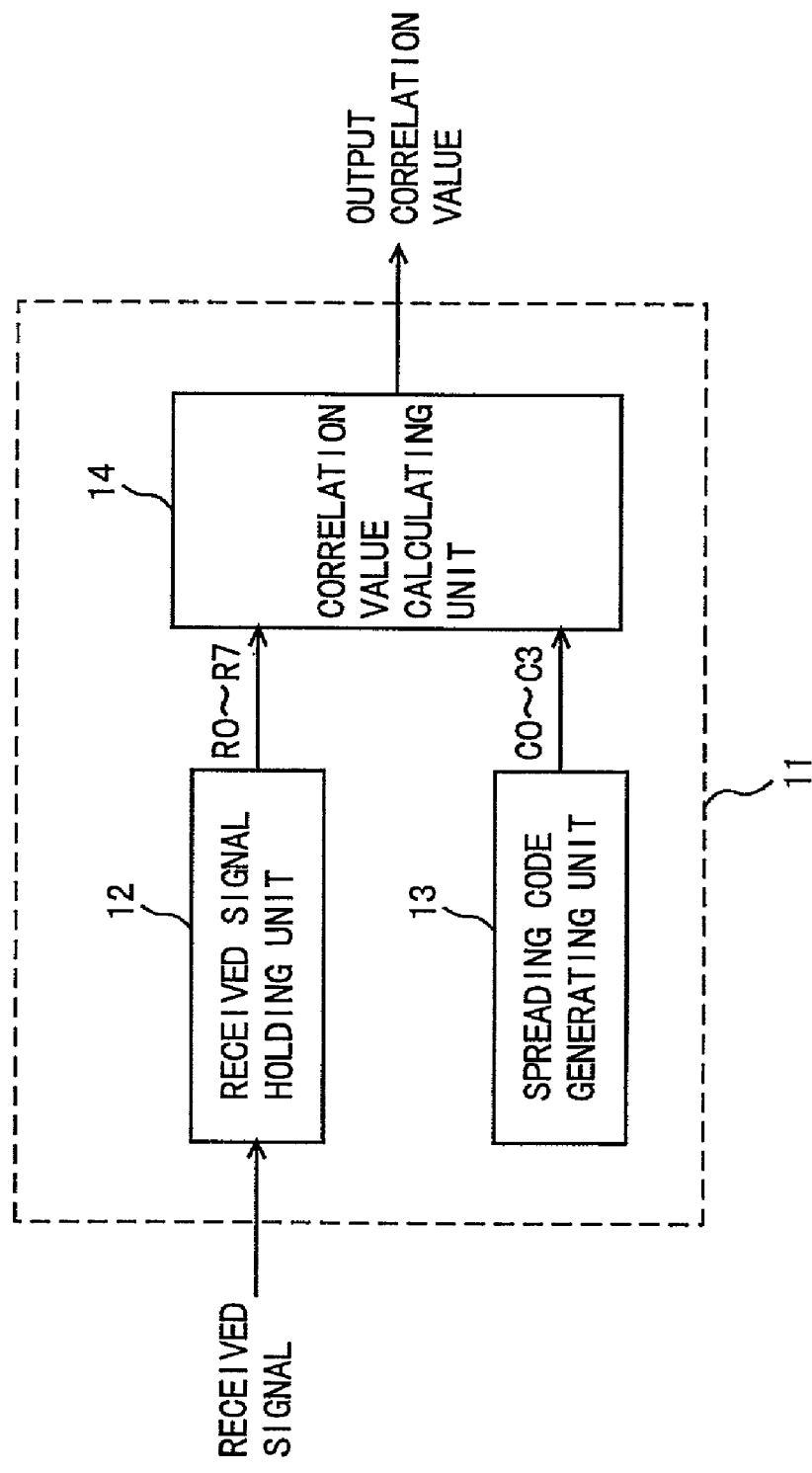
FIG. 2 is a schematic block diagram showing the digital matched filter according to a first embodiment of the invention that is applied to the mobile wireless terminal shown in FIG. 1.
Figure 14:
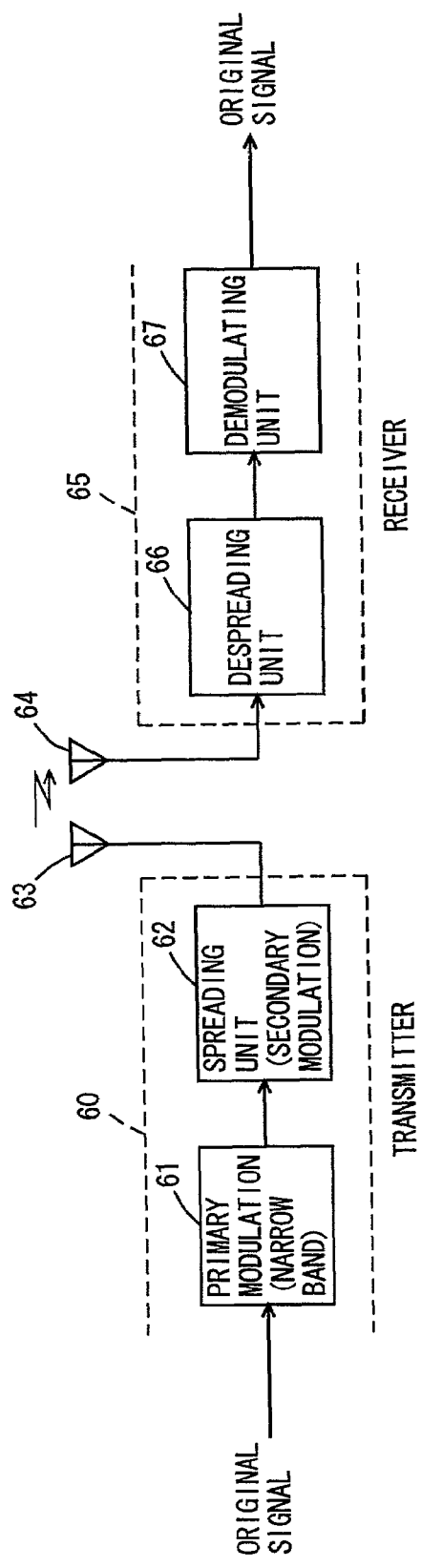
FIG. 14 is a schematic block diagram showing a basic structure of a transmitter and a receiver in a direct sequence spread spectrum communication system.

FIG. 2 is a schematic block diagram showing a digital matched filter according to the first embodiment of the invention that is applied to the mobile wireless terminal shown in FIG. 1. It is noted that despreading unit 66 (and initial synchronizing circuit 70 therein shown in FIG. 15) and demodulating unit 67 of receiver 65 shown in FIG. 14 generally constitute a reception-related modem unit (not shown) within modem 3a of baseband processing unit 3 in the mobile wireless terminal shown in FIG. 1. The digital matched filter (included in initial synchronizing circuit 70 in FIG. 15) of the embodiment shown in FIG. 2 is also included in the reception-related modem unit.

Referring to FIG. 2, digital matched filter 11 according to the first embodiment of the invention includes a received signal holding unit 12, a spreading code generating unit 13, and a correlation value calculating unit 14.

According to the first embodiment discussed below, the number of bits resultant from quantization of a received signal is three (each sample of a received signal is formed of three bits), the spreading code length (the number of chips in one frame of spreading codes) is four, the oversampling number for a received signal is two, and accordingly direct sequence spread spectrum communication is implemented.

Received signal holding unit 12 successively holds eight (8) samples (8=4 (spreading code length)×2 (oversampling number)), the samples input in time-series manner constituting a received signal sequence. Received signal holding unit 12 then outputs those samples as samples R0–R7 (tap outputs) in parallel that are provided to correlation value calculating unit 14.

Spreading code generating unit 13 generates a known spreading code sequence and outputs it as four spreading codes C0–C3 (tap coefficients) in parallel, the number of spreading codes (four) corresponding to the predetermined spreading code length. The output spreading codes are supplied to correlation value calculating unit 14.

Correlation value calculating unit 14 performs a product-sum operation for received signal samples R0–R7 and spreading codes C0–C3 to calculate a correlation value to be output.

Figure 3:
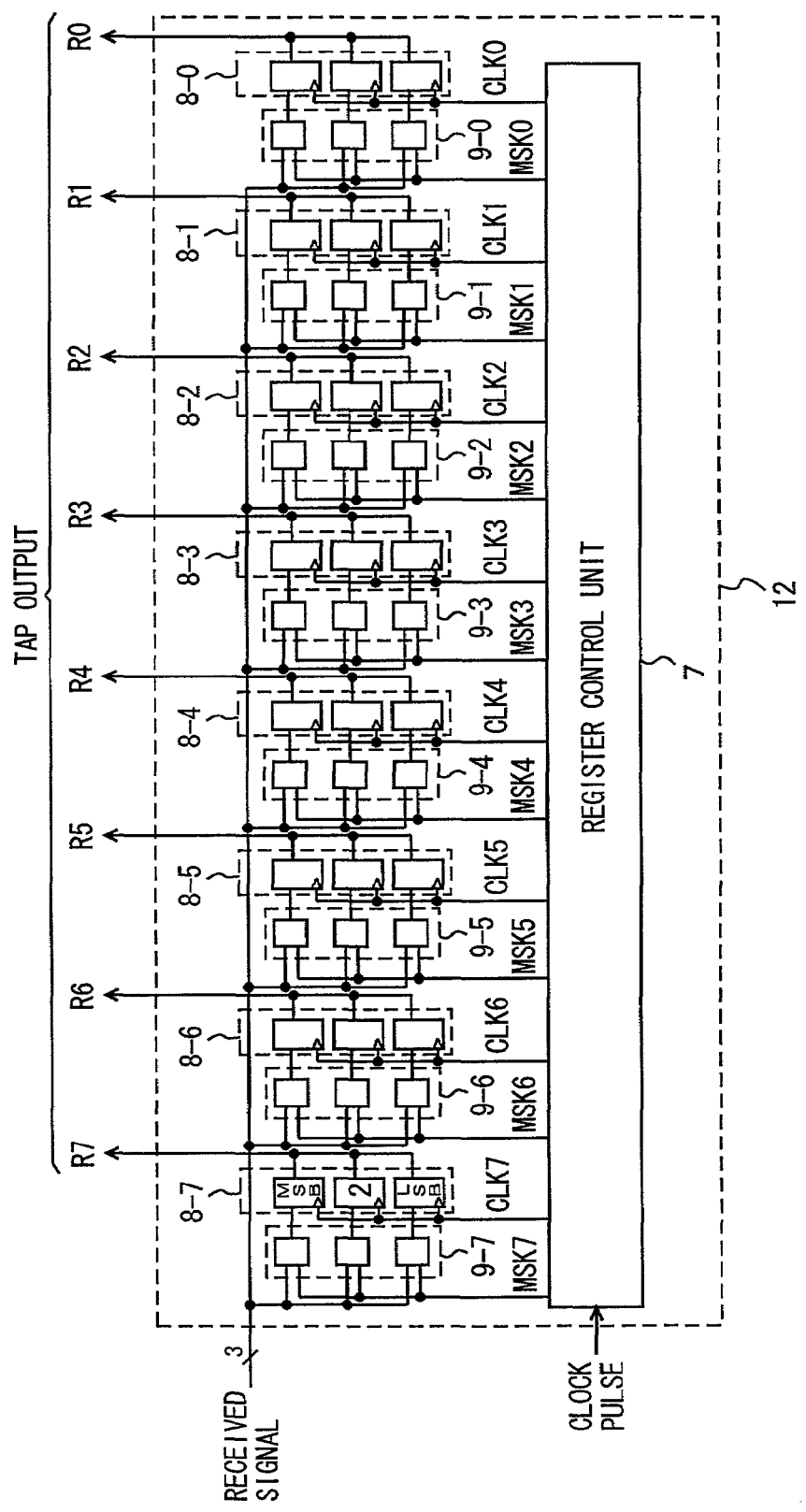
FIG. 3 is a block diagram showing in detail a structure of a received signal holding unit 12.

FIG. 3 is a block diagram showing in detail a structure of received signal holding unit 12. Referring to FIG. 3, received signal holding unit 12 includes a register control unit 7, eight received signal storage registers 8-0 to 8-7 for holding eight (8) samples respectively (8=4 (spreading code length)×2 (oversampling number)), and logic gate circuits 9-0 to 9-7.

Received signal storage registers 8-0 to 8-7 are each formed of three memory elements for respectively holding data of three bits (most significant bit "MSB", second order bit "2", least significant bit "LSB") constituting each sample.

At preceding stages of respective received signal storage registers 8-0 to 8-7, corresponding logic gate circuits 9-0 to 9-7 are provided. Each of logic gate circuits 9-0 to 9-7 is constituted of three gate logic elements corresponding to data of three bits forming each sample. The three gate logic elements have respective one inputs receiving corresponding three-bit data forming each sample of a received signal input in time-series manner.

Register control unit 7 receives from the outside clock pulses at a rate corresponding to the sampling rate of the received signal samples to generate mask signals MSK0 to MSK7 discussed below, and the three gate logic elements constituting each of logic gate circuits 9-0 to 9-7 have respective other inputs to which a corresponding mask signal is commonly provided.

Respective outputs from the three gate logic elements of each of logic gate circuits 9-0 to 9-7 are provided to respective inputs of the three memory elements forming a corresponding received signal storage register.

Register control unit 7 receives the clock pulses at the sampling rate mentioned above to generate control clock pulses CLK0 to CLK7 described below, and supplies the generated clock pulses to respective control inputs of three memory elements constituting each of received signal storage registers 8-0 to 8-7.

Received signal samples R0 to R7 each of three bits supplied from received signal storage registers 8-0 to 8-7 respectively are thus derived in parallel as tap outputs.

Received signal samples input in time-series manner are written into eight received signal storage registers 8-0 to 8-7 cyclically at a predetermined timing. Such a writing operation for the received signal storage registers is described in detail now below.

Figure 4:
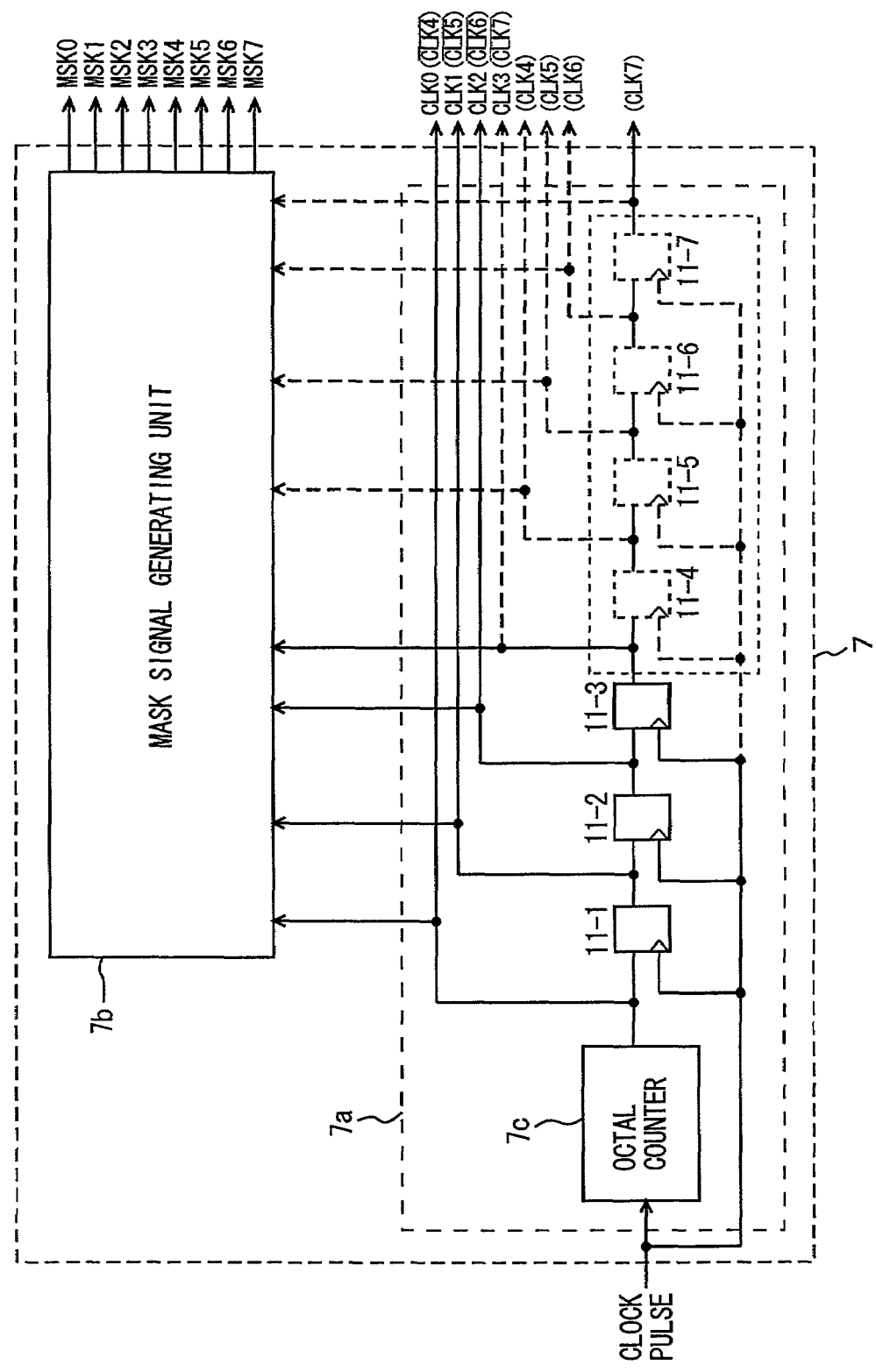
FIG. 4 is a block diagram showing a structure of a register control unit 7.

FIG. 4 is a block diagram showing a structure of register control unit 7 for controlling the writing operation for received signal storage registers 8-0 to 8-7. Referring to FIG. 4, register control unit 7 includes a control clock generating unit 7a and a mask signal generating unit 7b.

Control clock generating unit 7a includes an octal counter 7c and cascaded seven delay elements 11-1 to 11-7. Octal counter 7c generates control clock pulse CLK0 by frequency division by eight of the clock pulse at the sampling rate of the received signal mentioned above. This control clock pulse CLK0 is directly output and also delayed by one sample period in each of delay elements 11-1 to 11-7 and resultant control clock pulses CLK1 to CLK7 are output accordingly.

These control clock pulses CLK0 to CLK7 thus generated are supplied to received signal storage registers 8-0 to 8-7 in FIG. 3 respectively, and each control clock pulse is commonly provided to respective control inputs of three memory elements forming a corresponding received signal storage register.

It is noted that control clock pulses CLK4 to CLK7 may be substituted with inverted signals of CLK0 to CLK3. In this case, delay elements 11-4 to 11-7 can be removed as indicated by the enclosure of dotted line.

Mask signal generating unit 7b generates mask signals MSK0 to MSK7 based on a predetermined truth table according to control clock pulses CLK0 to CLK3 generated by control clock generating unit 7a.

FIG. 5 shows one example of the truth table of such a mask signal generating unit 7b. FIG. 6 is a block diagram showing one example of the logic circuit structure of mask signal generating unit 7b that implements the truth table shown in FIG. 5. In this example, delay elements 11-4 to 11-7 are not employed as mentioned above.

Referring to FIG. 5, logical states of control clock pulses CLK0 to CLK3 as input signals are indicated by "H" (high level) and "L" (low level). On the other hand, logical states of mask signals MSK0 to MSK7 as output signals are indicated by logical values "1" and "0."

For example, mask signal MSK5 takes logical value "1" for (5), (7), (13) and (15) in the truth table in FIG. 5, namely when control clock pulse CLK0 is "L" and CLK2 is "H," and takes logical value "0" for others namely when control clock pulse CLK0 is "H" and CLK2 is "L."

Mask signals MSK0 to MSK7 thus generated are provided respectively to logic gate circuits 9-0 to 9-7 in FIG. 3 and each mask signal is commonly provided to other inputs of respective three gate logic elements constituting a corresponding logic gate circuit.

Figure 7:
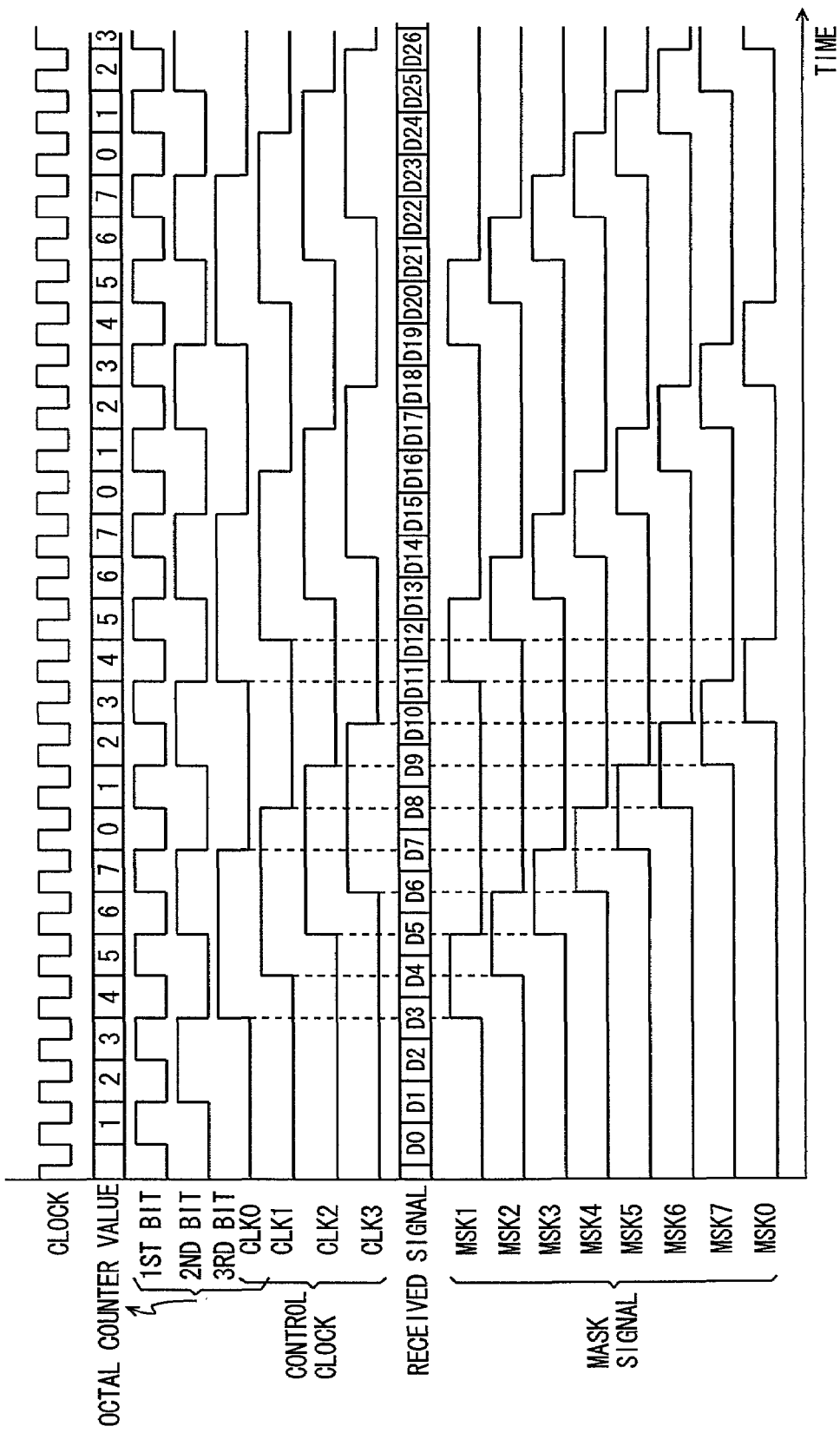
FIG. 7 is a timing chart showing timing of control clock pulses and mask signals generated by register control unit 7 in FIG. 4.

FIG. 7 is a timing chart showing the timing of control clock pulses CLK0 to CLK3 and mask signals MSK0 to MSK7 generated by register control unit 7 in FIG. 4.

Referring to FIG. 7, according the clock pulse at the sampling rate as shown at the uppermost stage, the count value of octal counter 7c is repeatedly counted up. Control clock pulse CLK0 is generated as a frequency-division clock pulse that rises to the high level at the third bit and maintains the high level for four sample clock periods.

This clock pulse CLK0 at the high level is delayed by delay elements 11-1 to 11-3 each by one sample clock period to generate control clock pulses CLK1 to CLK3.

Each received signal storage register receiving such a high level control clock pulse at respective control inputs of three memory elements is activated at the rising edge timing of the clock to hold a three-bit received signal sample applied at this timing.

Referring again to FIG. 7, according to control clock pulses CLK0 to CLK3, mask signals MSK0 to MSK7 are generated that rise to the high level at the timing shifted by one sample clock period and maintain the high level for two sample clock periods.

Each logic gate circuit receiving such a high level mask signal at respective other inputs of three gate logic elements is activated for the high level period, and passes three bits of a received signal sample supplied to the respective "one inputs" of the three gate logic elements during the active state, to respective inputs of three memory element of a corresponding signal storage register at the subsequent stage. Otherwise each logic gate circuit is inactivated with a corresponding mask signal fixed at the low level, so that input of the three-bit received signal sample to the received signal storage register at the subsequent stage is masked.

Figure 8:
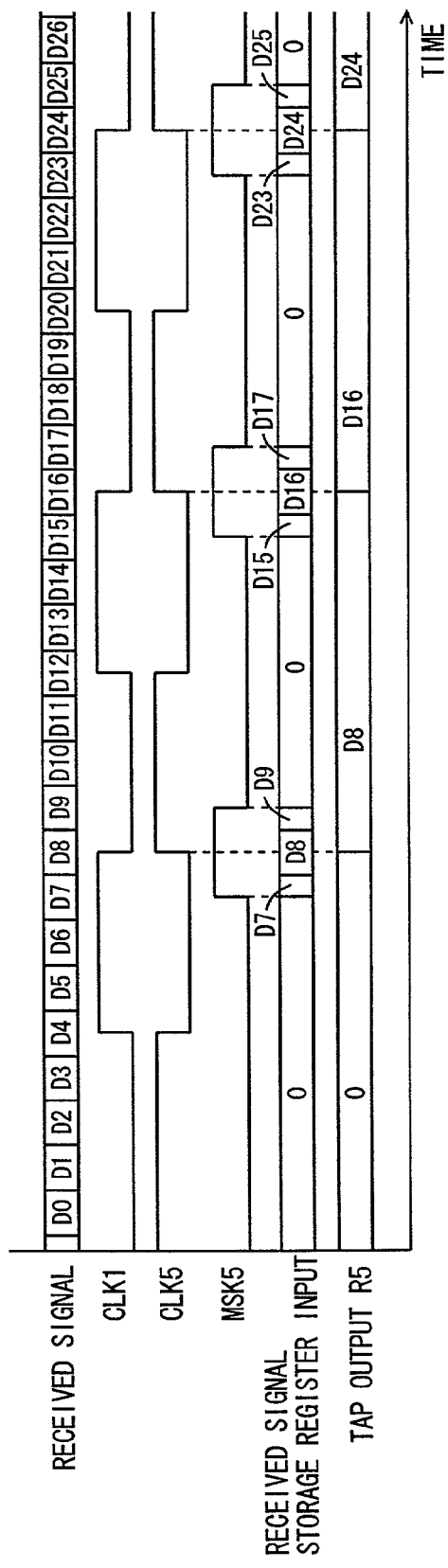
FIG. 8 is a partial timing chart shown by extracting an operation for writing a received signal sample into a received signal storage register 8-5 via a logic gate circuit 9-5.

FIG. 8 is a partial timing chart showing just an operation of writing a received signal sample to received signal storage register 8-5 via logic gate circuit 9-5. The entire timing chart is as shown in FIG. 7.

Referring to FIG. 8, control clock pulse CLK5 supplied to received signal storage register 8-5 is produced by inverting control clock pulse CLK1 by an inverter (not shown) as mentioned above.

Logic gate circuit 9-5 is constituted of three gate logic elements that are AND gates, selector circuits and the like. The gate circuit is opened only for the period in which corresponding mask signal MSK5 maintains logical value "1" to transmit a three-bit received signal sample to the received signal storage register 8-5 at the following stage.

Received signal storage register 8-5 takes in and stores the three-bit received signal sample at the rising edge timing of corresponding control clock pulse CLK5. In other words, register contents are updated at this timing.

In the example of FIG. 8, for two sample clock periods preceding and following the rewrite (update) timing of the received signal sample held by received signal storage register 8-5 (the rising edge timing of corresponding control clock pulse CLK5), corresponding logic gate circuit 9-5 at the preceding stage is opened. Received signal samples D7–D9, D15–D17 and D23-D25 are accordingly passed.

At respective rising edges of control clock pulse CLK5, received signal samples D8, D16 and D24 are stored successively in received signal storage register 8-5 and the register contents are updated. At any arbitrary timing, a received signal sample (D8, D16 or D24) stored at this time in received signal storage register 8-5 is output as a tap output R5 to correlation value calculating unit 14 in FIG. 2.

Other received signal storage registers 8-0 to 8-4, 8-6 and 8-7 operate in similar manner to received signal storage register 8-5 described above.

In this way, control by register control unit 7 allows samples of a received signal sequence supplied in time-series manner to be written cyclically at a predetermined timing into eight received signal storage registers 8-0 to 8-7 via corresponding eight logic gate circuits. At any timing except for this timing, writing of received signal samples to each received signal storage register is masked.

Consequently, unnecessary input of a received signal sample into a received signal storage register that is not at an original write timing is avoided, and thus that received signal storage register consumes no power.

It is noted that the load capacitance of each logic gate circuit is desirably smaller than that of each received signal storage register. Each logic gate circuit substitutes for the corresponding received signal storage register to receive unnecessary input signals. If the logic gate circuit has its load capacitance smaller than that of the storage register, the logic gate circuit consumes less power than the received signal storage register when the unnecessary signals are input, providing reduction of power consumption as a whole.

Figure 9:
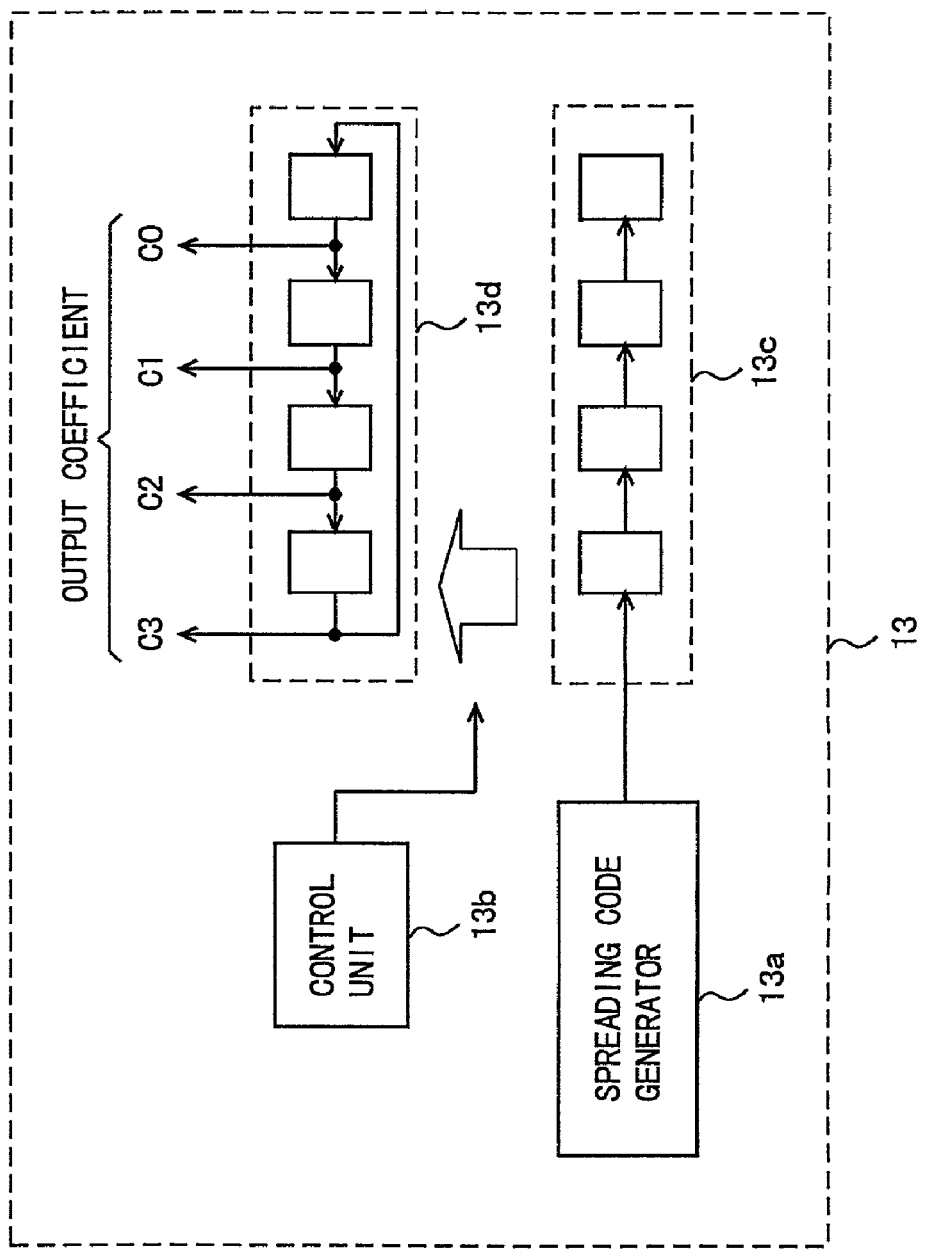
FIG. 9 is a block diagram showing in detail a structure of a spreading code generating unit 13 shown in FIG. 2.

FIG. 9 is a block diagram showing in detail the structure of spreading code generating unit 13 in FIG. 2. Referring to FIG. 9, spreading code generating unit 13 includes a spreading code generator 13a, a control unit 13b, a first coefficient register 13c and a second coefficient register 13d.

Spreading code generator 13a generates a known spreading code sequence based on a predetermined generating polynomial and supplies the generated sequence to the first coefficient register 13c. The first coefficient register 13c is a right shift register to successively store the generated spreading code sequence. The second coefficient register 13d is a left shift register of cyclic type.

Control unit 13b counts the number of chips of spreading codes generated by spreading code generator 13a. When control unit 13b determines that the count value reaches a spreading code length (the number of chips of one frame), it generates a control signal and supplies the signal to coefficient registers 13c and 13d.

For example, if the number of chips of spreading codes generated by spreading code generator 13a is less than the spreading code length, control unit 13b outputs control signal "0" to maintain the first coefficient register 13c in the active state and disable the second coefficient register 13d.

If the number of chips of spreading codes generated by spreading code generator 13a attains the spreading code length, control unit 13b outputs control signal "1" to disable the first coefficient register 13c and activate the second coefficient register 13d. Accordingly the contents of coefficient register 13c are written into coefficient register 13d and the contents of coefficient register 13d are supplied as tap coefficients C0 to C3 for despreading to correlation value calculating unit in FIG. 2.

Figure 10:
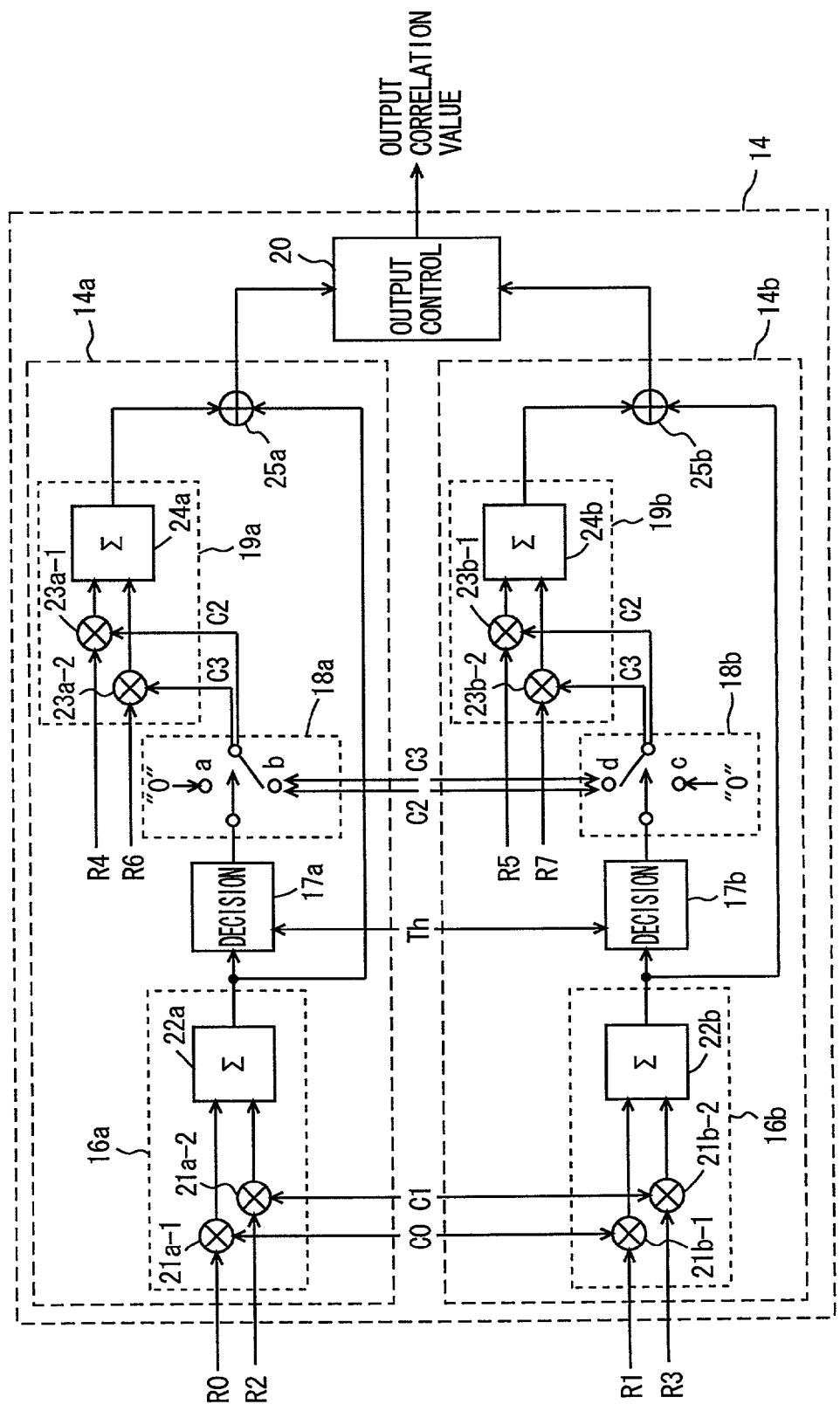
FIG. 10 is a block diagram showing in detail a structure of a correlation value calculating unit 14 shown in FIG. 2.

FIG. 10 is a block diagram showing in detail the structure of correlation value calculating unit 14 in FIG. 2. Referring to FIG. 10, correlation value calculating unit 14 includes a first correlation value calculating circuit 14a, a second correlation value calculating circuit 14b, and an output control unit 20.

The first correlation value calculating circuit 14a calculates a correlation value between even-numbered received signal samples (tap outputs) R0, R2, R4 and R6 supplied in parallel from received signal holding unit 12 and spreading codes (tap coefficients) C0, C1, C2 and C3 of one frame supplied in parallel from spreading code generating unit 13. The second correlation value calculating circuit 14b calculates a correlation value between odd-numbered received signal samples (tap outputs) R1, R3, R5 and R7 supplied in parallel from received signal holding unit 12 and spreading codes (tap coefficients) C0, C1, C2 and C3 of one frame supplied in parallel from spreading code generating unit 13.

Here, tap coefficients C0 to C3 each are actually a signal of one bit that is "0" or "1." However, in the correlation value calculation discussed below, "0" is replaced with +1 and "1" is replaced with −1 to be supplied to correlation value calculating circuits 14a and 14b.

The first correlation value calculating circuit 14a includes a first product-sum calculating unit 16a, a threshold decision unit 17a, a switch 18a, a second product-sum calculating unit 19a and an adder 25a.

In the first product-sum calculating unit 16a, tap outputs R0 and R2 are multiplied respectively by tap coefficients C0 and C1 by multipliers 21a-1 and 21a-2 and resultant values are added by an adder 22a. In other words, the first product-sum calculating unit 16a outputs the correlation value between tap outputs R0, R2 and tap coefficients C0, C1.

The correlation value is compared with a predetermined threshold value Th in threshold decision unit 17a. If the correlation value is equal to or greater than threshold value Th, threshold decision unit 17a controls switch 18a such that the movable contact of switch 18a turns to a fixed contact side b.

In this way, tap coefficients C2 and C3 are supplied to the second product-sum calculating unit 19a via switch 18a to be multiplied respectively by tap outputs R4 and R6 by multipliers 23a-1 and 23a-2. Resultant values are added by an adder 24a. The second product-sum calculating unit 19a thus outputs the correlation value between tap outputs R4, R6 and tap coefficients C2, C3.

The correlation values respectively calculated by the first and second product-sum calculating units 16a and 19a are added by adder 25a and the sum is supplied as a correlation value output of the first correlation value calculating circuit 14a to output control unit 20.

If the correlation value output from the first product-sum calculating unit 16a is smaller than predetermined threshold Th, threshold decision unit 17a controls switch 18a such that the movable contact of switch 18a turns to a fixed contact side a.

Value 0 is thus supplied via switch 18a to the second product-sum calculating unit 19a as tap coefficients C2 and C3 to be multiplied by tap outputs R4 and R6 by multipliers 23a-1 and 23a-2 respectively. Consequently, respective results are both 0 to be input to adder 24a. Adder 24a then stops its adding operation.

The second correlation value calculating circuit 14b includes a first product-sum calculating unit 16b, a threshold decision unit 17b, a switch 18b, a second product-sum calculating unit 19b, and an adder 25b.

In the first product-sum calculating unit 16b, tap outputs R1 and R3 are multiplied respectively by tap coefficients C0 and C1 by multipliers 21b-1 and 21b-2, and respective results are added by an adder 22b. In other words, the correlation value between tap outputs R1, R3 and tap coefficients C0, C1 is output from the first product-sum calculating unit 16b.

This correlation value is compared with predetermined threshold value Th by threshold decision unit 17b. If the correlation value is equal to or greater than threshold value Th, threshold decision unit 17b controls switch 18b such that the movable contact of switch 18b turns to a fixed contact side d.

Tap coefficients C2 and C3 are thus supplied via switch 18b to the second product-sum calculating unit 19b to be multiplied respectively by tap outputs R5 and R7 by multipliers 23b-1 and 23b-2. Respective results are then added by an adder 24b. In other words, the correlation value between tap outputs R5, R7 and tap coefficients C2, C3 is output from the second product-sum calculating unit 19b.

The correlation value determined by the first product-sum calculating unit 16b and that determined by the second product-sum calculating unit 19b are added by adder 25b to be output as a correlation value output of the second correlation value calculating circuit 14b to output control unit 20.

If the correlation value output of the first product-sum calculating unit 16b is smaller than predetermined threshold Th, threshold decision unit 17b controls switch 18b such that the movable contact of switch 18b turns to a fixed contact side c.

Value 0 is then supplied via switch 18b to the second product-sum calculating unit 19b as tap coefficients C2 and C3 to be multiplied respectively by tap outputs R5 and R7 by multipliers 23b-1 and 23b-2. Respective results are both 0 to be input to adder 24b. Accordingly, adder 24b stops its adding operation.

Output control unit 20 alternately selects the correlation value output from the first correlation value calculating circuit 14a and that from the second correlation value calculating circuit 14b at the sampling rate and outputs the selected values successively.

In correlation value calculating unit 14 according to the embodiment of the invention shown in FIG. 10, the first and second correlation value calculating circuits 14a and 14b are divided respectively into the first product-sum calculating units 16a and 16b at the anterior stage and the second product-sum calculating units 19a and 19b at the posterior stage. In this structure, only when the partial correlation value between the tap outputs and the tap coefficients that is determined by the first product-sum calculating unit at the anterior stage is greater than a predetermined threshold and thus there is a high possibility that the entire correlation value indicates a peak value, the second product-sum calculating unit at the posterior stage is operated to determine the entire correlation value.

The correlation value between received signal samples and spreading codes of one frame just momentarily attains the peak value in each frame period. At most of other instants, correlation value calculation does not need to continue to the end. According to the present invention, the operation of the product-sum calculating unit at the posterior stage is stopped in the period in which the correlation value is not likely to have the peak value and thus unnecessary power consumption is prevented.

Further, in correlation value calculating unit 14 according to the embodiment of the invention shown in FIG. 10, eight tap outputs R0 to R7 are divided into a first group consisting of even number taps R0, R2, R4 and R6 and a second group consisting of odd number taps R1, R3, R5 and R7 and the first and second correlation value calculating circuits 14a and 14b are provided respectively corresponding thereto.

For example, in digital matched filter 11 shown in FIG. 2, in order to perform by a single correlation value calculating circuit the product-sum operations speedily (at the oversampling rate) for tap outputs R0 to R7 supplied in parallel from received signal holding unit 12 and tap coefficients C0 to C3 supplied in parallel from spreading code generating unit 13 and accordingly calculate a correlation value, a complicated switch circuit is required for combining the eight tap outputs and four tap coefficients, resulting in a complicated circuit structure of correlation value calculating unit 14. In addition, correlation value calculating unit 14 itself consumes an increased power due to the high-speed operation at the sampling rate.

In the embodiment shown in FIG. 10, a plurality of correlation value calculating circuits are provided corresponding to respective groups of tap outputs. Correlation values output respectively from respective circuits are alternately selected at the sampling rate to be output successively. A correlation value is thus produced and output from correlation value calculating unit 14. Therefore, no complex switch circuit is necessary at the preceding stage of the correlation value calculating unit. In addition, each correlation value calculating circuit operates at a low operating frequency (half the sampling rate in the example of FIG. 10). Therefore, reduction is possible of power consumption in each correlation value calculating circuit.

In the 3rd Generation Partnership Project (3GPP), standardization is now in progress of CDMA system of wide band (Wide-Band Code Division Multiple Access) that is the next-generation mobile communication system.

FIG. 11 is a block diagram showing a structure of a digital matched filter 31 for a downlink synchronization channel (P-SCH: Primary Synchronization Channel) in compliance with a system specified in the 3GPP.

Figure 15:
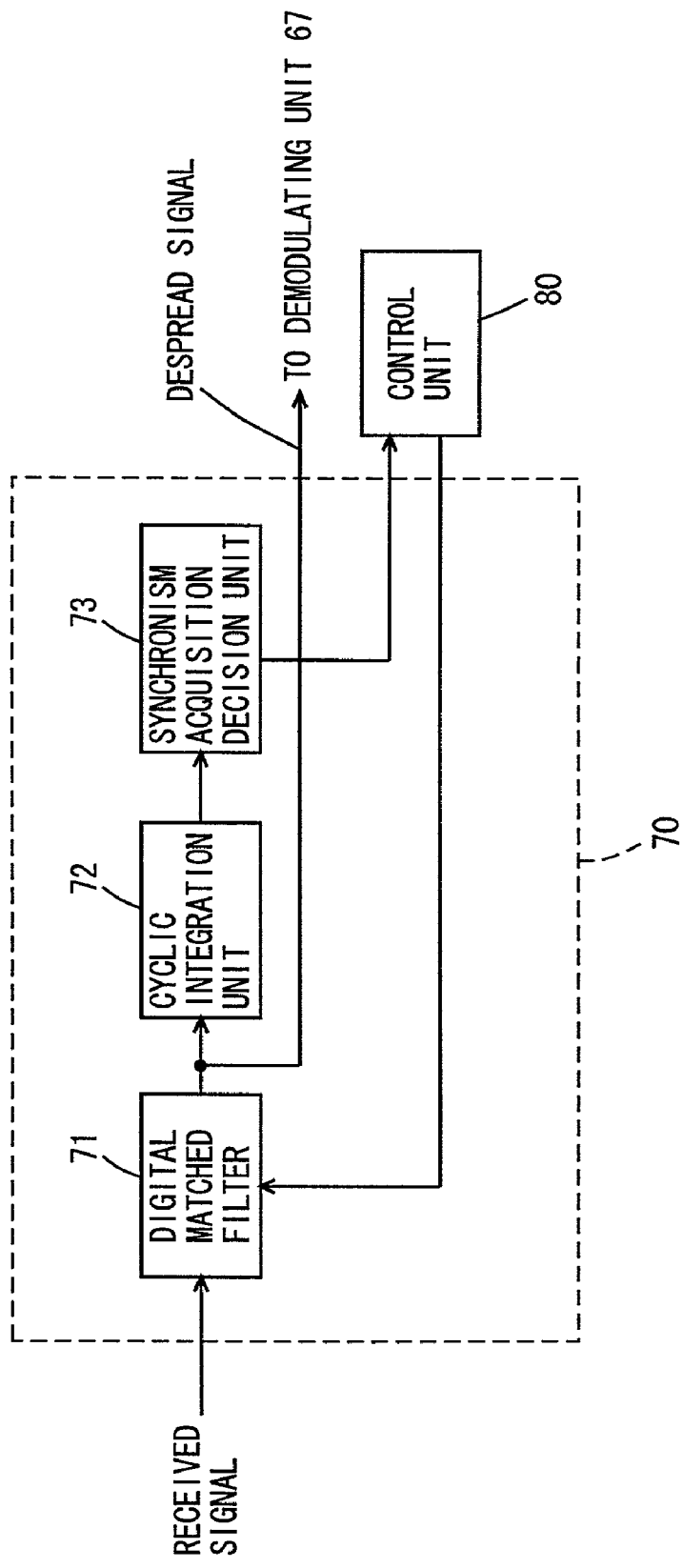
FIG. 15 is a schematic block diagram showing a conventional initial synchronizing circuit for establishing initial synchronism and a control circuit for the synchronizing circuit.

Digital matched filter 11 in the embodiment shown in FIG. 2 is illustrated for easy understanding of description as the one that calculates a correlation value for a received signal in one system on the condition that it is used in initial synchronizing circuit 70 in FIG. 15.

On the other hand, according to the example shown in FIG. 11, in a despreading unit (66 in FIG. 14) of a receiver, a received signal of the P-SCH is divided into two systems as I phase (in phase components) and Q phase (orthogonal components) and digital matched filters according to the invention shown in FIG. 2 are employed for the two systems respectively.

Specifically, a digital matched filter (I-DMF) 31a is provided for calculating a correlation value between the I phase components of the received signal of the P-SCH and spreading codes and a digital matched filter (Q-DMF) 31b is provided for calculating a correlation value between the Q phase components of the received signal of the P-SCH and spreading codes.

Each of digital matched filters 31a and 31b is constituted of digital matched filter 11 according to the embodiment of the invention shown in FIGS. 2–10. One input of a power adder 31c receives the correlation value between the I phase components of the received signal and spreading codes that is calculated by digital matched filter 31a. The other input of power adder 31c receives the correlation value between the Q phase components of the received signal and spreading codes that is calculated by digital matched filter 31b. Power adder 31c integrates respective correlation values of the I phase components and Q phase components and outputs a resultant value.

FIGS. 12A and 12B are waveform charts corresponding to one symbol period of a received signal indicating the peak value of an output correlation value supplied from the cyclic integration unit (FIG. 15) connected at the subsequent stage of digital matched filter 31 for the P-SCH shown in FIG. 11.

FIG. 12A is a waveform chart for a high signal to noise ratio (SNR) and FIG. 12B is the one for a low SNR. As shown in FIG. 12A, favorable peak characteristics of the correlation value are achieved when the SNR is high. On the other hand, as shown in FIG. 12B, a lower SNR invites influence of noise on respective outputs of digital matched filters 31a and 31b, however, the influence of noise components is reduced by addition (averaging) by cyclic integration unit 72 (FIG. 15) and thus relatively favorable correlation value peak characteristics can be accomplished as output of digital matched filter 31.

Figure 13:
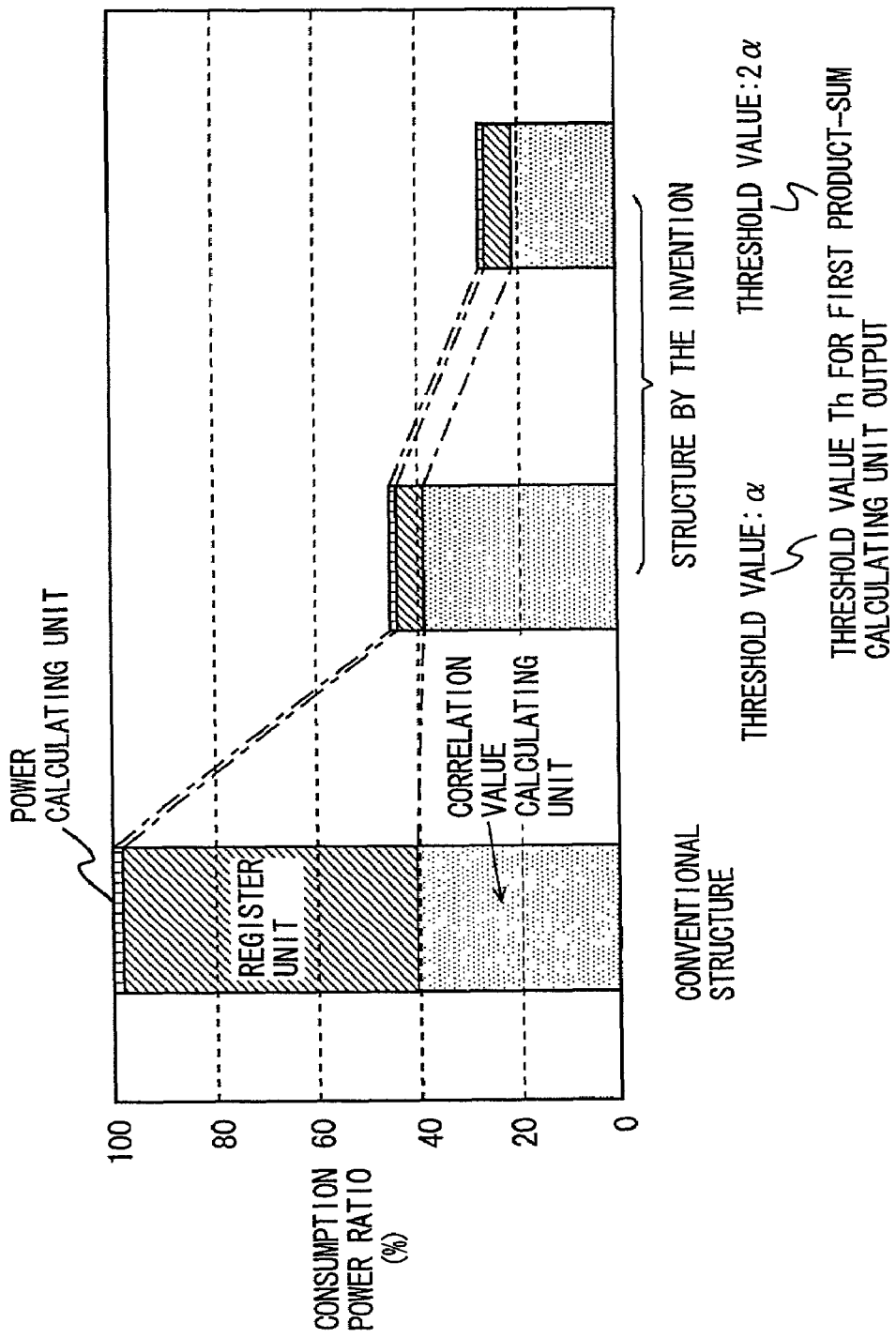
FIG. 13 visually shows the effect of reducing power consumption by the present invention.
Figure 16:
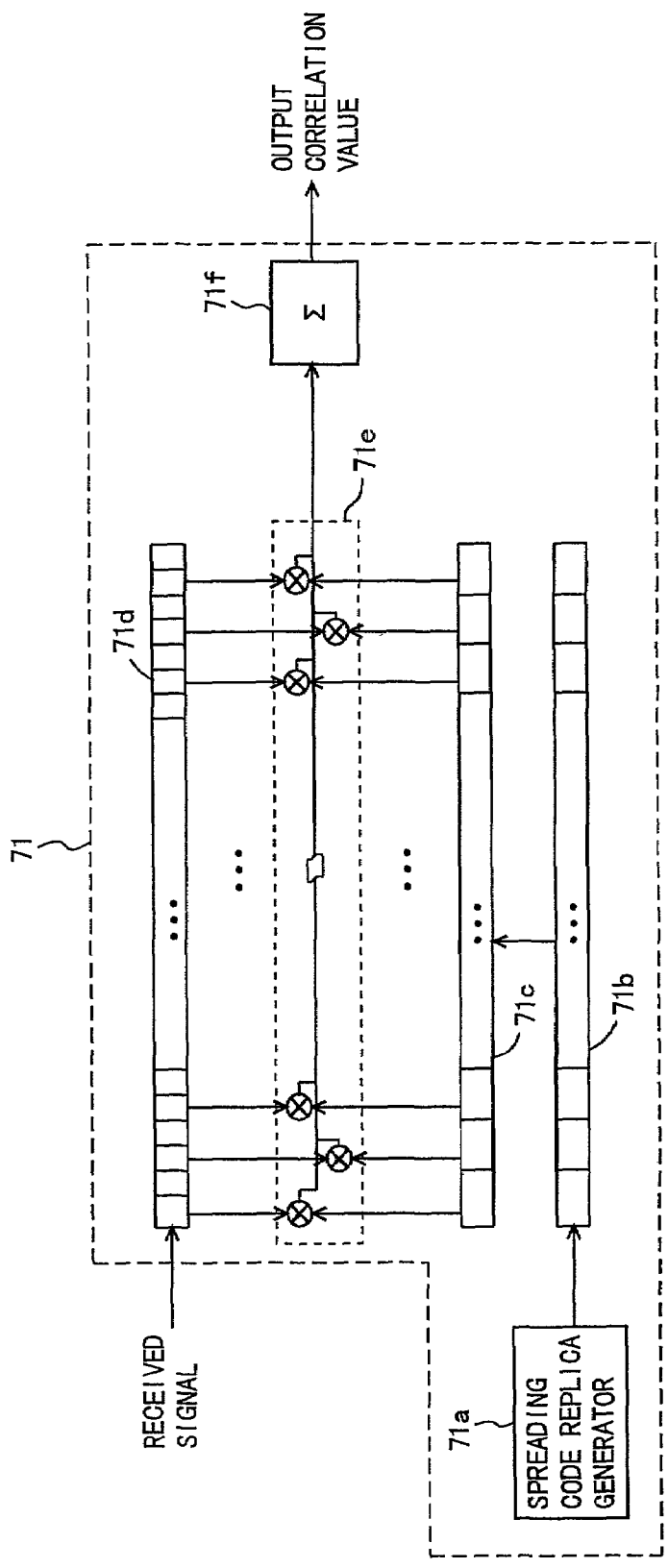
FIG. 16 is a block diagram showing a structure of a transversal filter as one example of a digital matched filter 71.

FIG. 13 is a graph visually showing the effect or reducing power consumption according to the invention. The leftmost bar graph represents power consumption of the conventional digital matched filter employing the shift register for signal storage as shown in FIG. 16. The consumed power is here set at 100%.

The central bar graph in FIG. 13 shows that power consumption by the register unit is remarkably reduced as implemented by the embodiment in FIG. 3 by employing parallel registers instead of the shift register for storing received signals, and masking, at the logic gate circuit, input to each register. Further, unless the correlation value determined at the anterior stage of the correlation value calculating unit exceeds threshold Th=$\alpha$, the posterior stage is prevented from constantly operating and thus consumption power of the correlation value calculating unit is reduced.

The rightmost bar graph in FIG. 13 shows power consumption when threshold Th is doubled to $2\alpha$. In this case, any unnecessary operation of the correlation value calculating unit at the posterior stage is more severely eliminated so that reduction in power consumption is more remarkable in the correlation value calculating unit.

As heretofore discussed, according to the present invention, partial product-sum operation for received signals and spreading codes is performed to determine the possibility that the correlation value has the peak value. Only when the possibility is ensured, all product-sum operations are conducted for calculating the correlation value. Otherwise, product-sum operation is just partially performed. A significant reduction in power consumption is thus achieved in the product-sum calculating circuits for correlation value calculation.

Further, according to the invention, received signal storage registers are provided in parallel for received signals. Inputs to registers except for registers at the original write timing are masked. Power consumption due to unnecessary signal input to received signal storage registers not at the write timing can thus be prevented.

In addition, according to the invention, a plurality of product-sum calculating circuits for correlation value calculation are provided in parallel corresponding to a plurality of groups of received signal samples. The operating frequency of each product-sum calculating circuit can thus be lowered and reduction is possible of power consumed for calculating the correlation value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital matched filter for despreading on reception side a received signal sequence having been spread on transmission side, comprising:

received signal holding means for successively holding a predetermined number of samples among samples constituting said received signal sequence input in time-series manner;

spreading code generating means for generating a spreading code sequence for said despreading; and correlation value calculating means for calculating a correlation value between said predetermined number of samples held in said received signal holding means and said generated spreading code sequence, said correlation value calculating means including first product-sum calculating means for calculating a correlation value between a part of the predetermined number of samples held in said received signal holding means and a part of the generated spreading code sequence corresponding to said part of the predetermined number of samples held in said received signal holding means, second product-sum calculating means for calculating a correlation value between a remaining part of the predetermined number of samples held in said received signal holding means and a remaining part of the generated spreading code sequence corresponding to said remaining part of the predetermined number of samples held in said received signal holding means, and decision means for comparing the correlation value output from said first product-sum calculating means with a predetermined threshold value to stop calculation by said second product-sum calculating means when said decision means decides that the correlation value output from said first product-sum calculating means does not exceed said predetemiined threshold value.

2. A digital matched filter for despreading on reception side a received signal sequence having been spread on transmission side, comprising:

received signal holding means for successively holding samples constituting said received signal sequence input in time-series manner, said received signal holding means including a predetermined number of storage circuits for holding samples of said received signal sequence input in time-series manner in parallel in the same predetermined number as said predetermined number of storage circuits, logic circuits provided at respective preceding stages of said predetennined number of storage circuits, said logic circuits each activated to pass an input signal to a corresponding one of said predetermined number of storage circuits and mask the input signal otherwise, first control means for cyclically causing write enable state of said predetermined number of storage circuits at a predetermined timing to cyclically write said samples of the received signal sequence input in time-series manner into said predetermined number of storage circuits at said predetermined timing, and second control means for cyclically activating said logic circuits at said predetermined timing to cyclically pass said samples of the received signal sequence input in time-series manner to said predetermined number of storage circuits at said predetermined timing; and said digital matched filter further comprising spreading code generating means for generating a spreading code sequence for said despreading; and correlation value calculating means for calculating a correlation value between said samples of the received signal sequence input in time-series manner held in parallel in said predetermined number of storage circuits and said spreading code sequence.

3. The digital matched filter according to claim 2, wherein said logic circuits each have an input load capacitance smaller than an input load capacitance of each respective corresponding predetermined storage circuits.

4. A digital matched filter for despreading on reception side a received signal sequence having been spread on transmission side, comprising:

received signal holding means for successively holding samples constituting said received signal sequence input in time-series manner, said received signal holding means including a predetermined number of storage circuits for holding samples of said received signal sequence input in time-series manner in parallel in the same predetermined number as said predetermined number of storage circuits, logic circuits provided at respective preceding stages of said predetermined number of storage circuits, said logic circuits each activated to pass an input signal to a corresponding one of said predetermined number of storage circuits and mask the input signal otherwise, first control means for cyclically causing write enable state of said predetermined number of storage circuits at a predetermined timing to cyclically write said samples of the received signal sequence input in time-series manner into said predetermined number of storage circuits at said predetermined timing, and second control means for cyclically activating said logic circuits at said predetermined timing to cyclically pass said samples of the received signal sequence input in time-series manner to said predetermined number of storage circuits at said predetermined timing; and said digital matched filter further comprising spreading code generating means for generating a spreading code sequence for said despreading; and correlation value calculating means for calculating a correlation value between said samples of the received signal sequence held in parallel in said predetermined number of storage circuits and said spreading code sequence, said correlation value calculating means including first product-sum calculating means for calculating a correlation value between a part of the predetemiined number of samples held in said predetermined number of storage circuits and a corresponding part of the generated spreading code sequence, second product-sum calculating means for calculating a correlation value between a remaining part of the predetermined number of samples held in said predetermined number of storage circuits and a remaining part of the generated spreading code sequence, and decision means for comparing the correlation value output from said first product-sum calculating means with a predetennined threshold value to stop calculation by said second product-sum calculating means when said decision means decides that the correlation value output from said first product-sum calculating means does not exceed said predetermined threshold value.

5. The digital matched filter according to claim 4, wherein said logic circuits each have an input load capacitance smaller than an input load capacitance of each respective corresponding storage circuits.

6. A digital matched filter for despreading on reception side a received signal sequence having been spread on transmission side, comprising:

received signal holding means for successively holding samples constituting said received signal sequence input in time-series manner, said received signal holding means including a first predetermined number of storage circuits for holding samples of said received signal sequence input in time-series manner in parallel in the same predetermined number as said first predetermined number of storage circuits, said first predetermined number of storage circuits being divided into a second predetermined number of groups, logic circuits provided at respective preceding stages of said first predetermined number of storage circuits, said logic circuits each activated to pass an input signal to a corresponding one of said predetermined number of storage circuits and mask the input signal otherwise, first control means for cyclically causing write enable state of said first predetermined number of storage circuits at a predetermined timing to cyclically write said samples of the received signal sequence input in time series manner into said first predetermined number of storage circuits at said predetermined timing, and second control means for cyclically activating said logic circuits at said predetermined timing to cyclically pass said samples of the received signal sequence input in time series manner to said first predetermined number of storage circuits at said predetermined timing;

said digital matched filter further comprising spreading code generating means for generating a spreading code sequence for said despreading; and correlation value calculating means provided respectively corresponding to said second predetermined number of groups each for calculating a correlation value between samples of said received signal sequence input in time-series manner held in a corresponding one of said second predetermined number of groups and a part of said spreading code sequence, each of said correlation value calculating means including first product-sum calculating means for calculating a correlation value between a first part of samples held in the storage circuits of a respective one of said second predetermined number of groups, and, in lines 32–34, "between samples held in the storage circuits of a second one of said second predetermined number of groups" is replaced by between a second part of samples held in the storage circuits of the respective one of said second predetermined number of groups and a corresponding first part of said spreading codes sequence, second product-sum calculating means for calculating a correlation value between samples held in the storage circuits of a second one of said second predetermined number of groups and a corresponding second part of said spreading codes sequence, and decision means for comparing the correlation value output from each of said first product-sum calculating means with a predetermined threshold value to stop calculation by each corresponding said second product-sum calculating means when said decision means decides that the correlation value output from said first product-sum calculating means does not exceed said predetermined threshold value; and said digital matched filter further comprising output control means for successively outputting in time-series manner respective correlation values output from respective ones of said correlation value calculating means as correlation values output from one system.

7. The digital matched filter according to claim 6, wherein said logic circuits each have an input load capacitance smaller than an input load capacitance of each respectively corresponding storage circuits.

8. A mobile wireless terminal for digital radio communication comprising reception-related modem means for demodulating received digital data and signal processing means for processing a signal received by said reception-related modem means to output the processed signal, said reception-related modem means including a digital matched filter for despreading on reception side a received signal sequence having been spread on transmission side, said digital matched filter comprising:

received signal holding means for successively holding a predetermined number of samples among samples constituting said received signal sequence input in time-series manner;

spreading code generating means for generating a spreading code sequence for said despreading; and correlation value calculating means for calculating a correlation value between said predetermined number of samples held in said received signal holding means and said generated spreading code sequence, said correlation value calculating means including first product-sum calculating means for calculating a correlation value between a part of the predetermined number of samples held in said received signal holding means and a corresponding part of the generated spreading codes sequence, second product-sum calculating means for calculating a correlation value between a remaining part of the predetermined number of samples held in said received signal holding means and a corresponding remaining part of the generated spreading codes, and decision means for comparing the correlation value output from said first product-sum calculating means with a predetermined threshold value to stop calculation by said second product-sum calculating means when said decision means decides that the correlation value output from said first product-sum calculating means does not exceed said predetermined threshold value.

9. A mobile wireless terminal for digital radio communication comprising:

reception-related modem means for demodulating received digital data and signal processing means for processing a signal received by said reception-related modem means to output the processed signal, said reception-related modem means including a digital matched filter for despreading on reception side a received signal sequence having been spread on transmission side, said digital matched filter comprising:

received signal holding means for successively holding samples constituting said received signal sequence input in time-series manner, said received signal holding means including a predetermined number of storage circuits for holding samples of said received signal sequence input in time-series manner in parallel in the same predetermined number as said predetermined number of storage circuits, logic circuits provided at respective preceding stages of said predetermined number of storage circuits, said logic circuits each activated to pass an input signal to a corresponding one of said predetermined number of storage circuits and mask the input signal otherwise, first control means for cyclically causing write enable state of said predetermined number of storage circuits at a predetermined timing to cyclically write said samples of the received signal sequence input in time-series manner into said predetermined number of storage circuits at said predetermined timing, and second control means for cyclically activating said logic circuits at said predetermined timing to cyclically pass said samples of the received signal sequence input in time-series manner to said predetermined number of storage circuits at said predetermined timing; and said digital matched filter further comprising spreading code generating means for generating a spreading code sequence for said despreading; and correlation value calculating means for calculating a correlation value between said samples of the received signal sequence input in time-series manner held in parallel in said predetermined number of storage circuits and said spreading code sequence.

10. The mobile wireless terminal according to claim 9, wherein said logic circuits each have an input load capacitance smaller than an input load capacitance of each respective corresponding storage circuits.

11. A mobile wireless terminal for digital radio communication comprising reception-related modem means for demodulating received digital data and signal processing means for precessing a signal received by said reception-related modem means to output the processed signal, said reception-related modem means including a digital matched filter for despreading on reception side a received signal sequence having been spread on transmission side, said digital matched filter comprising:

received signal holding means for successively holding samples constituting said received signal sequence input in time-series manner, said received signal holding means including a predetermined number of storage circuits for holding samples of said received signal sequence input in time-series manner in parallel in the same predetermined number as said predetermined number of storage circuits, logic circuits provided at respective preceding stages of said predetennined number of storage circuits, said logic circuits each activated to pass an input signal to a corresponding one of said predetermined number of storage circuits and mask the input signal otherwise, first control means for cyclically causing write enable state of said predetermined number of storage circuits at a predetermined timing to cyclically write said samples of the received signal sequence input in time-series manner into said predetermined number of storage circuits at said predetermined timing, and second control means for cyclically activating said logic circuits at said predetermined timing to cyclically pass said samples of the received signal sequence input in time-series manner to said predetermined number of storage circuits at said predetermined timing; and said digital matched filter further comprising spreading code generating means for generating a spreading code sequence for said despreading; and correlation value calculating means for calculating a correlation value between said samples of the received signal sequence held in parallel in said predetermined number of storage circuits and said spreading code sequence, said correlation value calculating means including first product-sum calculating means for calculating a correlation value between a part of the predetermined number of samples held in said predetermined number of storage circuits and a corresponding part of the generated spreading code sequence, second product-sum calculating means for calculating a correlation value between a remaining part of the predetermined number of samples held in said predetermined number of storage circuits and a remaining part of the generated spreading code sequence, and decision means for comparing the correlation value output from said first product-sum calculating means with a predetermined threshold value to stop calculation by said second product-sum calculating means when said decision means decides that the correlation value output from said first product-sum calculating means does not exceed said predetermined threshold value.

12. The mobile wireless terminal according to claim 11, wherein said logic circuits each have an input load capacitance smaller than an input load capacitance of each respectively corresponding storage circuits.

13. A mobile wireless terminal for digital radio communication comprising reception-related modem means for demodulating received digital data and signal processing means for processing a signal received by said reception-related modem means to output the processed signal, said reception-related modem means including a digital matched filter for despreading on reception side a received signal sequence having been spread on transmission side, said digital matched filter comprising:

received signal holding means for successively holding samples constituting said received signal sequence input in time-series manner, said received signal holding means including a first predetermined number of storage circuits for holding samples of said received signal sequence input in time-series manner in parallel in the same predetermined number as said predetermined number of storage circuits, said first predetermined number of storage circuits being divided into a second predetermined number of groups, logic circuits provided at respective preceding stages of said first predetermined number of storage circuits, said logic circuits each activated to pass an input signal to a corresponding one of said predetermined number of storage circuits and mask the input signal otherwise, first control means for cyclically causing write enable state of said first predetermined number of storage circuits at a predetermined timing to cyclically write said samples of the received signal sequence input in time-series manner into said first predetermined number of storage circuits at said predetermined timing, and second control means for cyclically activating said logic circuits at said predetermined timing to cyclically pass said samples of the received signal sequence input in time-series manner to said first predetermined number of storage circuits at said predetermined timing;

said digital matched filter further comprising spreading code generating means for generating a spreading code sequence for said despreading; and correlation value calculating means provided respectively corresponding to said second predetermined number of groups each for calculating a correlation value between samples of said received signal sequence of a corresponding one of said second predetermined number of groups and a part of said spreading code sequence, each of said correlation value calculating means including first product-sum calculating means for calculating a correlation value between a first part of samples held in the storage circuits of a respective one of said second predetermined number of groups, and, in lines 38–40, "between samples held in the storage circuits of a second one of said second predetermined number of groups" is replaced by between a second part of samples held in the storage circuits of the respective one of said second predetermined number of groups and a corresponding first part of said spreading codes sequence, second product-sum calculating means for calculating a correlation value between samples held in the storage circuits of a second one of said second predetermined number of groups and a corresponding second part of said spreading codes sequence, and decision means for comparing the correlation value output from said first product-sum calculating means with a predetermined threshold value to stop calculation by said second product-sum calculating means when said decision means decides that the correlation value output from said first product-sum calculating means does not exceed said predetermined threshold value; and said digital matched filter further comprising output control means for successively outputting in time-series manner respective correlation values output from respective ones of said correlation value calculating means as correlation values output from one system.

14. The mobile wireless terminal according to claim 13, wherein said logic circuits each have an input load capacitance smaller than an input load capacitance of each respective corresponding storage circuits.

\* \* \* \* \*

UNITED STATES PATENT AND TRADEMARK OFFICE
CERTIFICATE OF CORRECTION

PATENT NO.        : 7,016,400 B2
APPLICATION NO.   : 09/745996
DATED             : March 21, 2006
INVENTOR(S)       : Shoji Goto Page 1 of 1

It is certified that error appears in the above-identified patent and that said Letters Patent is hereby corrected as shown below:

Column 22, line 64, please delete "predetermined".

Column 24, line 34 through 39, please delete sentences as following:

", and in lines 32-34, "between samples held in the storage circuits of a second one of said second predetermined number of groups" is replaced by between a second part of samples held in the storage circuits of the respective one of said second predetermined number of groups"

Column 24, line 43, please change "between samples" into --between a second part of samples--.

Column 24, line 44, please change "a second one" into --the respective one--.

Column 28, line 23 through 28, please delete sentences as following:

", and in lines 38-40, "between samples held in the storage circuits of a second one of said second predetermined number of groups" is replaced by between a second part of samples held in the storage circuits of the respective one of said second predetermined number of groups"

Column 28, line 31, please change "between samples" into --between a second part of samples--.

Column 28, line 32, please change "a second one" into --the respective one--.

Signed and Sealed this

Twenty-seventh Day of February, 2007

JON W. DUDAS
*Director of the United States Patent and Trademark Office*